US 8,526,207 B2

(12) United States Patent
Yamagiwa et al.

(10) Patent No.: US 8,526,207 B2
(45) Date of Patent: Sep. 3, 2013

(54) BI-DIRECTIONAL SWITCH, ALTERNATING-CURRENT TWO-WIRE SWITCH, SWITCHING POWER SOURCE CIRCUIT, AND METHOD OF DRIVING BI-DIRECTIONAL SWITCH

(75) Inventors: Hiroto Yamagiwa, Osaka (JP); Shingo Hashizume, Kyoto (JP); Manabu Yanagihara, Osaka (JP); Ayanori Ikoshi, Kyoto (JP)

(73) Assignee: Panasonic Corporation, Osaka (JP)

( * ) Notice: Subject to any disclaimer, the term of this patent is extended or adjusted under 35 U.S.C. 154(b) by 169 days.

(21) Appl. No.: 13/158,934

(22) Filed: Jun. 13, 2011

(65) Prior Publication Data
US 2011/0305054 A1 Dec. 15, 2011

(30) Foreign Application Priority Data
Jun. 15, 2010 (JP) ................. 2010-136648

(51) Int. Cl.
*H02M 7/02* (2006.01)
*H03K 17/94* (2006.01)
*H03K 17/687* (2006.01)

(52) U.S. Cl.
USPC ............................ 363/125; 327/427; 327/109

(58) Field of Classification Search
USPC ................. 363/125; 327/109, 472; 257/107, 257/119, 213, E29.001
See application file for complete search history.

(56) References Cited

U.S. PATENT DOCUMENTS

| 2008/0074158 A1 | 3/2008 | Ryu et al. | |
| 2009/0065810 A1 | 3/2009 | Honea et al. | |
| 2010/0046256 A1 | 2/2010 | Kanno et al. | |
| 2010/0097105 A1* | 4/2010 | Morita et al. | ............... 327/109 |
| 2011/0204807 A1* | 8/2011 | Hashizume et al. | ........... 315/246 |

FOREIGN PATENT DOCUMENTS

| JP | 3964912 | 6/2007 |
| JP | 2008-079448 | 4/2008 |
| WO | WO 2008/062800 A1 | 5/2008 |

* cited by examiner

*Primary Examiner* — Victor A Mandala
*Assistant Examiner* — Whitney T Moore
(74) *Attorney, Agent, or Firm* — McDermott Will & Emery LLP

(57) ABSTRACT

A semiconductor device 101 in a bi-directional switch includes: a first electrode 109A, a second electrode 109B, a first gate electrode 112A, and a second gate electrode 112B. In a transition period: when the potential of the first electrode 109A is higher than the potential of the second electrode 109B, a voltage lower than the first threshold voltage is applied to the first gate electrode 112A and a voltage higher than the second threshold value voltage is applied to the second gate electrode 112B; and otherwise, a voltage higher than the first threshold value voltage is applied to the first gate electrode, and a voltage lower than the second threshold value voltage is applied to the second gate electrode.

15 Claims, 17 Drawing Sheets

○ Substrate voltage = 0 V
● Substrate voltage = -100 V

US 8,526,207 B2

BI-DIRECTIONAL SWITCH, ALTERNATING-CURRENT TWO-WIRE SWITCH, SWITCHING POWER SOURCE CIRCUIT, AND METHOD OF DRIVING BI-DIRECTIONAL SWITCH

BACKGROUND OF THE INVENTION (1) Field of the Invention

The present invention relates to bi-directional switches, and in particular to (A) a bi-directional switch which (i) includes a semiconductor device including Group-III nitride semiconductor and materials, (ii) is intended for protection against an inrush current, and (iii) is for use in an alternating-current two-wire switch, a switching power source circuit, and the like, (B) the alternating-current two-wire switch circuit, the switching power source, and the like that include the bi-directional switch, and (C) a method of driving the bi-directional switch.

(2) Description of the Related Art

With the recent application of inverter techniques to electric devices, inrush currents that occur at the time when such electric devices are activated may increase electromagnetic interference to nearby electric appliances and loads on the electric devices themselves. At the time of the activation, a large current flows also in a switching power source etc. in order to increase an output voltage, which increases loads on the power source component.

Patent Reference 1 (Japanese Patent Publication No. 3964912) discloses a method for reducing these inrush currents. FIG. 18 is a diagram showing a structure of a device including a bi-directional switch, a power source, and a load according to Patent Reference 1. As shown in FIG. 18, MOSFETs Q1 and Q2, diodes D1 and D2, resistors R1 to R6, capacitors C1 and C2 are inserted in a power source line. The method is intended to control resistance in the power source line by adjusting the gate voltages of the MOSFETs Q1 and Q2, and thereby reducing the amount of an inrush current.

SUMMARY OF THE INVENTION

However, the inrush current reducing circuit shown in the conventional art requires that an increased number of components must be added to the power source line therein. Such components are the MOSFETs, the diodes connected to the gate electrodes of the MOSFETs, the resistors, and the capacitors. Furthermore, since the MOSFETs and diodes are inserted in the power source line, it is impossible to ignore heat caused thereby.

The present invention has been conceived in view of the aforementioned problems, and aims to provide (A) a bi-directional switch capable of reducing the amount of an inrush current without increasing the number of components, (B) an alternating-current two-wire switch circuit, a switching power source, and the like that include the bi-directional switch, and (C) a method of driving the bi-directional switch.

In recent years, introduction of Group-III nitride semiconductors represented by GaN or semiconductor devices using a wide-gap semiconductor such as silicon carbide (SiC) has been considered with an aim to reduce conduction losses by breaking material limits. A wide-gap semiconductor has a breakdown electric field higher than that of Si by about one digit. Due to a spontaneous polarization and a Piezo polarization, charge occurs at the hetero junction interface between aluminum gallium nitride (AlGaN) and gallium nitride. In this way, a two-dimensional electron gas (2 DEG) layer is formed which has a sheet carrier concentration of $1\times10^{13}$ $cm^{-2}$ or higher and a high mobility of 1000 $cm^2$ V/sec or higher even when it is undoped. For this reason, such AlGaN/GaN hetero junction field effect transistor (AlGaN/GaN-HFET) is expected as a power switching transistor which achieves a low on-resistance and a high voltage resistance.

In particular, it is possible to form a bi-directional semiconductor device using a single semiconductor device by configuring it to have two gate electrodes using such an AlGaN/GaN hetero junction (for example, see Patent Reference 2 (International Publication No. 2008/062800)). Furthermore, the bi-directional semiconductor device configured as mentioned above is a circuit equivalent to two transistors connected in series in mutually opposite directions, and thus is capable of reducing the on-resistance more significantly. Therefore, the bi-directional semiconductor device is capable of controlling not only current that flows from a first electrode side to a second electrode side but also current that flows from the second electrode side to the first electrode side. For this reason, with the bi-directional semiconductor device, it is possible to achieve miniaturization and electric power reduction more significantly than in the case of using a conventional bi-directional semiconductor device obtained by combining a triac element used as a bi-directional switch, and a power transistor that is either a power MOSFET (a metal oxide semiconductor field effect transistor) or an IGBT (insulated gate bipolar transistor).

Here, the inventors have implemented a bi-directional switch which reduces the amount of an inrush current without increasing the number of components and an alternating-current two-wire switch, a switching power source etc. using the bi-directional switch, by studying methods of controlling a bi-directional semiconductor device using a Group-III nitride semiconductor.

In order to solve the aforementioned problems, a bi-directional switch according to an aspect of the present invention includes a semiconductor device and a control unit, wherein the semiconductor device includes: a semiconductor stack formed on a substrate, having a channel region, and including one of (i) a nitride semiconductor and (ii) a semiconductor including silicon carbide; a first electrode and a second electrode formed at an interval on the semiconductor stack; a first gate electrode formed between the first electrode and the second electrode; and a second gate electrode formed between the first gate electrode and the second electrode, and the control unit is configured to: apply, to the first gate electrode, a voltage that is relative to a potential of the first electrode and lower than a first threshold voltage, and apply, to the second gate electrode, a voltage that is relative to a potential of the second electrode and higher than a second threshold voltage, when the potential of the first electrode is higher than the potential of the second electrode in a transition period corresponding to a transition state at a time when the semiconductor device is activated; and apply, to the first gate electrode, a voltage that is relative to a potential of the first electrode and higher than the first threshold voltage, and apply, to the second gate electrode, a voltage that is relative to a potential of the second electrode and lower than a second threshold voltage, when the potential of the first electrode is lower than the potential of the second electrode in the transition period.

With this structure, the semiconductor device performs, when activated, a reverse blocking in the transition period (corresponding to, for example, a first oscillation cycle that starts from the activation and lasts at least one oscillation cycle immediately after the first oscillation cycle). Therefore, when a current flows from the second electrode to the first electrode of the semiconductor device, the bi-directional switch operates with an on-resistance higher than an on-resistance in a conduction state. Accordingly, it is possible to achieve a bi-directional switch which reduces the amount of an inrush current that flows in a power source line at the time of activation. Furthermore, it is possible to reduce the number of components because there is no need to provide, as components, a diode, a resistor, and a capacitor that are connected to each of the first and second gate electrodes.

Here, the semiconductor device may have a first operation mode, a second operation mode, and a third operation mode, the control unit may be configured to control switching between the first, second, and third operation modes, the first operation mode is for performing reverse blocking for blocking a current flow from one of the first electrode and the second electrode to the other, the one of the first electrode and the second electrode having a potential lower than a potential of the other, the second operation mode is a conduction state in which a current flows bi-directionally between the first electrode and the second electrode, the third operation mode is a blocking state in which any current does not flow between the first electrode and the second electrode in both directions, and the control unit may be configured to make the semiconductor device into the first operation mode in the transition period.

In this way, it is possible to control switching between the first, second, and third operation modes using the control unit.

Here, the semiconductor device may be a normally-off type semiconductor device, and in the first operation mode, the control unit may be configured to apply a voltage to one of the first gate electrode and the second gate electrode, the voltage having the same potential as the potential of the other one of the first electrode and the second electrode which has the higher potential, and the one of the first gate electrode and the second gate electrode being located at a side of the other which has the higher potential.

In this way, it is possible to simplify the structure of the control unit.

Here, in the first operation mode, the control unit may be configured to apply a negative voltage to one of the first gate electrode and the second gate electrode, the negative voltage being relative to the potential of the other one of the first electrode and the second electrode which has the higher potential, and the one of the first gate electrode and the second gate electrode being located at a side of the other which has the higher potential.

In this way, in the reverse blocking, the on-voltage is increased by the amount of a negative voltage applied. In other words, the high on-resistance makes it possible to achieve the bi-directional switch which reduces the amount of an inrush current that flows in the power source line at the time of the activation.

Here, the semiconductor device may include a substrate electrode, and the control unit may include a substrate potential control unit configured to control a potential of the substrate electrode.

With this structure, it is also possible to change the on-resistance of the semiconductor device by controlling the potential of the substrate electrode of the semiconductor device. Thus, it is possible to achieve the bi-directional switch which reduces the amount of an inrush current that flows in the power source line at the time of the activation.

Here, the bi-directional switch may include a first semiconductor layer formed between the first gate electrode and the semiconductor stack, and form a PN junction with the semiconductor stack; and a second semiconductor layer formed between the second gate electrode and the semiconductor stack, and forms a PN junction with the semiconductor stack.

In this way, it is possible to achieve the bi-directional switch which reduces the amount of an inrush current even when the bi-directional switch is configured to include first and second semiconductor layers each of which is formed between a corresponding one of first and second gate electrodes and the semiconductor stack and forms a PN junction with the semiconductor stack.

Here, the bi-directional switch may include an insulating layer below each of the first gate electrode and the second gate electrode.

In this way, it is possible to achieve the bi-directional switch which reduces the amount of an inrush current even when the first gate electrode and the second gate electrode are electrodes for insulating gates.

Here, each of the first gate electrode and the second gate electrode may form a Schottky junction with the semiconductor stack.

In this way, it is possible to achieve a bi-directional switch which reduces the amount of an inrush current even when each of the first gate electrode and the second gate electrode forms a Schottky junction with the semiconductor stack.

Here, the substrate may be a silicon substrate.

Here, the substrate may be a silicon carbide substrate.

Here, the substrate may be a sapphire substrate.

An alternating-current two-wire switch according to an aspect of the present invention is connected between an alternating-current power source and a load, the alternating-current two-wire switch including a bi-directional switch connected in series with the alternating-current power source and the load such that the bi-directional switch, the alternating-current power source, and the load form a closed circuit.

In this way, it is possible to achieve an alternating-current two-wire switch which reduces the amount of an inrush current, electromagnetic interference, and processing loads on the load, by using the above-described bi-directional switch as a bi-directional switch for use in the alternating-current two-wire switch.

Here, the alternating-current two-wire switch may further include: a full wave rectifier connected between the first electrode and the second electrode to perform full wave rectification of an alternating-current power voltage supplied from an alternating-current power source; and a power source circuit which smoothes the alternating-current power voltage output from the full wave rectifier after the full wave rectification, and supplies a direct-current power voltage, wherein the control unit may further include: a gate driver circuit which receives the direct-current power voltage supplied from the power source circuit, and outputs a control signal to the first gate electrode and the second electrode; and a control circuit which inputs the control signal to the gate driver circuit.

In this way, it is possible to supply the direct-current power voltage for the control unit that constitutes the alternating-current two-wire switch from the full wave rectifier and the power source circuit.

A switching power source circuit according to an aspect of the present invention including: an input terminal connected to a voltage source; an output terminal which outputs a direct-current power voltage; one of an inductor and a transducer, the one accumulating energy and inserted between the input terminal and the output terminal; a rectifier diode inserted between the input terminal and the output terminal, and connected with an output side of the one of the inductor and the transducer; and a switch which controls the energy to be accumulated in the one of the inductor and the transducer, the second electrode is connected to the output side of the one of the inductor and the transducer, and the potential of the second electrode is fixed at a potential higher than the potential of the first electrode.

In this way, it is possible to configure the switching power source which reduces the amount of an inrush current by fixing the relationship between the potential of the first electrode and the potential of the second electrode in the bi-directional switch.

Furthermore, a method of driving a bi-directional switch according to the present invention includes: determining whether or not a potential of the first electrode is higher than a potential of the second electrode, in a transition period corresponding to a transition state at a time when the semiconductor device is activated; applying, to the first gate electrode, a voltage that is relative to the potential of the first electrode and lower than a first threshold voltage, and apply, to the second gate electrode, a voltage that is relative to the potential of the second electrode and higher than a second threshold voltage, when the potential of the first electrode is higher than the potential of the second electrode in a transition period corresponding to a transition state at a time when the semiconductor device is activated; and applying, to the first gate electrode, a voltage that is relative to the potential of the first electrode and higher than the first threshold voltage, and applying, to the second gate electrode, a voltage that is relative to the potential of the second electrode and lower than a second threshold voltage, when the potential of the first electrode is lower than the potential of the second electrode in the transition period.

A bi-directional switch, an alternating-current two-wire switch, and a switching power source circuit according to the present invention are capable of reducing the amount of an inrush current at the time of activation using a reduced number of components.

FURTHER INFORMATION ABOUT TECHNICAL BACKGROUND TO THIS APPLICATION

The disclosure of Japanese Patent Application No. 2010-136648 filed on Jun. 15, 2010 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Embodiment 1

Embodiment 1 is described with reference to the drawings.

Figure 1:
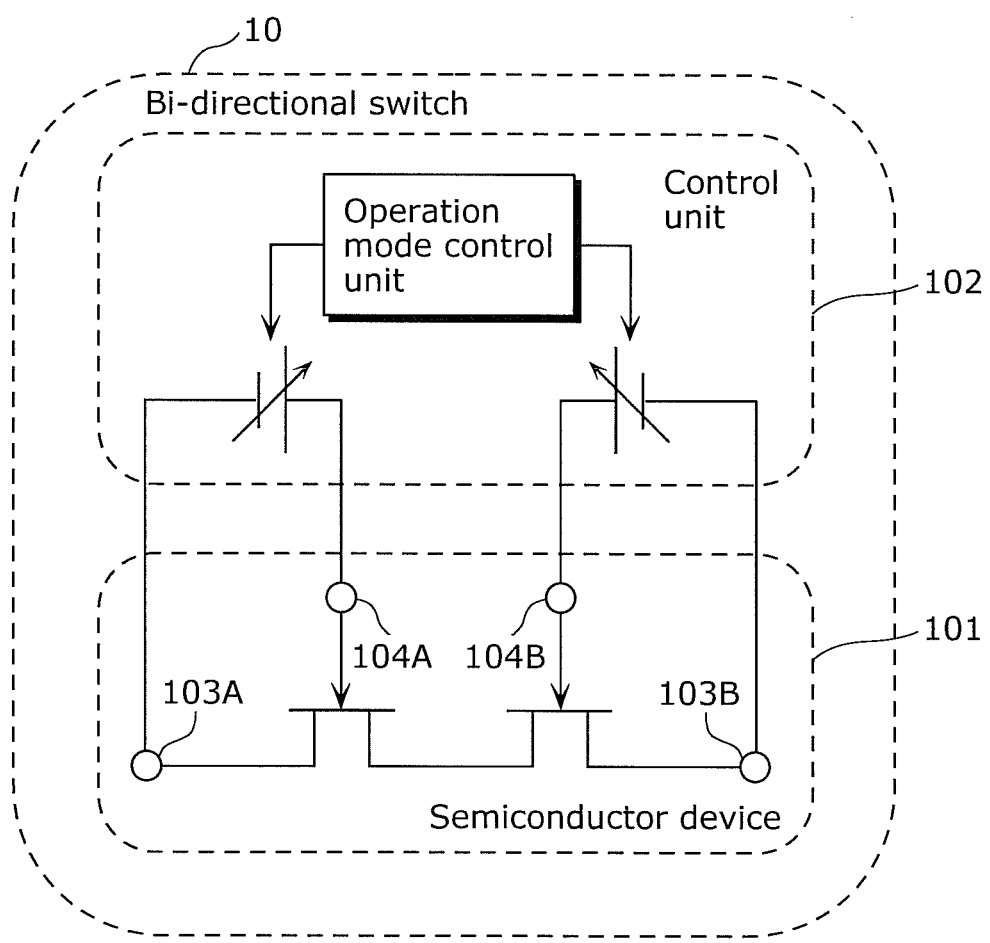
FIG. 1 is a block diagram showing an exemplary structure of a bi-directional switch according to Embodiment 1.
Figure 2:
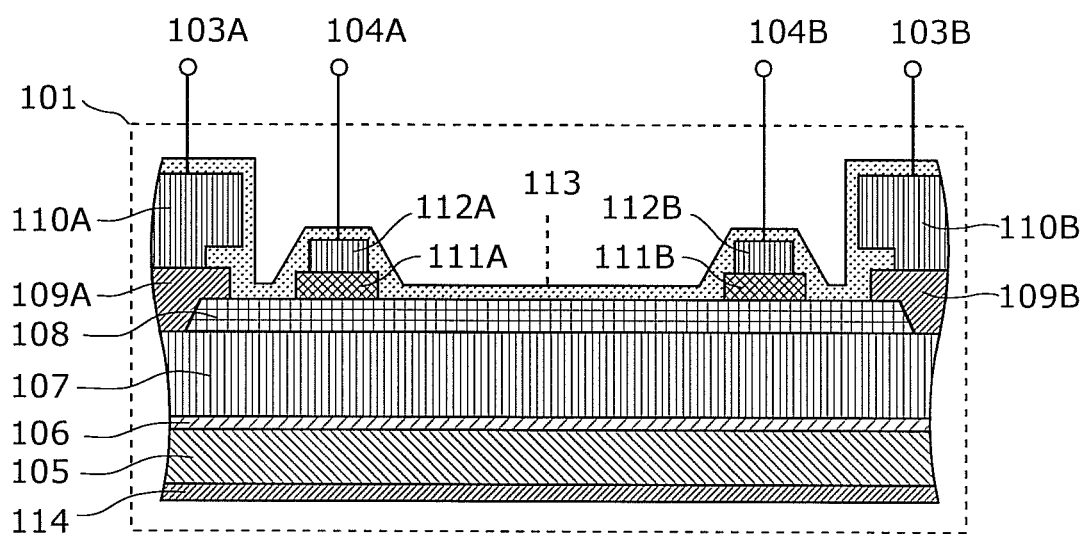
FIG. 2 is a cross-sectional view of a semiconductor device using a Group-III compound semiconductor according to Embodiment 1.

FIG. 1 is a block diagram showing an exemplary structure of a bi-directional switch according to Embodiment 1. FIG. 2 is a cross-sectional view of a semiconductor device using a Group-III compound semiconductor according to Embodiment 1. The semiconductor device in FIG. 1 includes a semiconductor device 101 and a control unit 102.

As shown in FIG. 1, a bi-directional switch 10 according to Embodiment 1 includes the semiconductor device 101 and the control unit 102.

The semiconductor device 101 includes: a semiconductor stack that is (i) formed on a Si substrate 105, (ii) having a channel region, and (iii) including semiconductors (106 to 108) each of which is either a nitride semiconductor or a semiconductor including silicon carbide; a first electrode 109A and a second electrode 109B formed at an interval on the semiconductor stack; a first gate electrode 112A formed between the first electrode 109A and the second electrode 109B; a second gate electrode 112B formed between the first gate electrode 112A and the second electrode 109B; a first control terminal 104A electrically connected to the first gate electrode 112A; and a second control terminal 104B electrically connected to the second gate electrode 112B.

The control unit 102 controls a voltage VG1 to be applied to the first gate electrode 112A through the first control terminal 104A and a voltage VG2 to be applied to the second gate electrode 112B through the second control terminal 104B. More specifically, the control unit is configured to: apply, to the first gate electrode, a voltage that is relative to a potential of the first electrode and lower than a first threshold voltage, and apply, to the second gate electrode, a voltage that is relative to a potential of the second electrode and higher than a second threshold voltage, when the potential of the first electrode is higher than the potential of the second electrode in a transition period corresponding to a transition state at a time when the semiconductor device is activated; and apply, to the first gate electrode, a voltage that is relative to a potential of the first electrode and higher than the first threshold voltage, and apply, to the second gate electrode, a voltage that is relative to a potential of the second electrode and lower than a second threshold voltage, when the potential of the first electrode is lower than the potential of the second electrode in the transition period.

The structure of the semiconductor device 101 is illustrated with reference to FIG. 2.

The semiconductor device 101 includes: a buffer layer 106 formed on a silicon (Si) substrate 105 that is conductive to have a thickness of approximately 1 µm; and a semiconductor stack (a first semiconductor layer 107 and a second semiconductor layer 108) formed on the buffer layer 106.

The buffer layer 106 includes a nitride aluminum (AlN) layer having a thickness of approximately 10 nm and a gallium nitride (GaN) layer having a thickness of approximately 10 nm which are alternately stacked. The semiconductor stack includes a first semiconductor layer 107 and a second semiconductor layer 108 having a band gap larger than that of the first semiconductor layer 107 which are stacked sequentially from the substrate side. In this embodiment, the first semiconductor layer 107 is an undoped gallium nitride (GaN) layer having a thickness of approximately 2 µm, and the second semiconductor layer 108 is an n-type aluminum gallium nitride (AlGaN) layer having a thickness of approximately 20 µm.

Due to a spontaneous polarization and a Piezo polarization, charge occurs in the proximity of the hetero junction interface between the first semiconductor layer 107 including gallium nitride (GaN) and the second semiconductor layer 108 including aluminum gallium nitride (AlGaN). In this way, a channel region is formed which is a two-dimensional electron gas (2 DEG) layer having a sheet carrier concentration of $1 \times 10^{13}$ cm$^{-2}$ or higher and a high mobility of 1000 cm$^2$ V/sec or higher.

On the semiconductor stack, that is, the first semiconductor layer 107 and the second semiconductor layer 108, the first electrode 109A and the second electrode 109B are formed at an interval. Each of the first electrode 109A and the second electrode 109B includes a titan (Ti) layer and an aluminum (Al) layer which are stacked, and forms an Ohmic contact with the channel region. FIG. 2 shows an example case for reducing a contact resistance. In FIG. 2, the second semiconductor layer 108 is partly removed, and the first semiconductor layer 107 is dug by approximately 40 nm so that the first electrode 109A and the second electrode 109B are made contact with the interface between the first semiconductor layer 107 and the second semiconductor layer 108. Here, the first electrode 109A and the second electrode 109B may be formed on the second semiconductor layer 108.

A first electrode wire 110A including Au and Ti is formed on the first electrode 109A, and is electrically connected to the first electrode 109A. A second electrode wire 110B including Au and Ti is formed on the second electrode 109B, and is electrically connected to the second electrode 109B.

A first p-type semiconductor layer 111A and a second p-type semiconductor layer 111B that constitute double gates of the semiconductor device 101 which applies current bi-directionally are selectively formed at an interval in the region between the first electrode 109A and the second electrode 109B on the second semiconductor layer 108. A first gate electrode 112A and a second gate electrode 112B are formed on the first p-type semiconductor layer 111A and the second p-type semiconductor layer 111B, respectively. Each of the first p-type semiconductor layer 111A and the second p-type semiconductor layer 111B is composed of a stack of a palladium (Pd) layer and a gold (Au) layer, and forms an Ohmic contact with a corresponding one of the first p-type semiconductor layer 111A and the second p-type semiconductor layer 111B.

A protection film 113 including a silicon nitride (SiN) is formed to cover the first electrode wire 110A, the first electrode 109A, the second semiconductor layer 108, the first p-type semiconductor layer 111A, the first gate electrode 112A, the second p-type semiconductor layer 111B, the second gate electrode 112B, the second Ohmic electrode 109B, and the second electrode wire 110B.

A back surface electrode 114 (also referred to as a substrate electrode) that is a stack of a nickel (Ni) layer, a chrome (Cr) layer, and a silver (Ag) layer, and has a thickness of approximately 800 nm is formed on the back surface of the substrate 105. This back surface electrode 114 forms an Ohmic contact with the Si substrate 105.

Each of the first p-type semiconductor layer 111A and the second p-type semiconductor layer 111B includes p-type GaN doped with magnesium (Mg) and has a thickness of approximately 300 nm. Each of the first p-type semiconductor layer 111A and the second p-type semiconductor layer 111B forms a PN junction with the second semiconductor layer 108. In this way, when, for example, the voltage between the first electrode 109A and the first gate electrode 112A is equal to or smaller than 0 V, a depletion layer expands in the channel region from the first p-type semiconductor layer 111A, and thus it is possible to block the current flowing in the channel. Likewise, when, for example, the voltage between the second electrode 109B and the second gate electrode 112B is equal to or smaller than 0 V, a depletion layer expands in the channel region from the second p-type semiconductor layer 111B, and thus it is possible to block the current flowing in the channel. Accordingly, it is possible to achieve a switching element having double gates that performs a so-called normally-off operation. Here, the distance between the first p-type semiconductor layer 111A and the second p-type semiconductor layer 111B is designed enough to be resistant to the maximum voltage that is applied to the first electrode 109A and the second electrode 109B.

When the voltage of the first gate electrode 112A is higher than the voltage of the first electrode 109A by approximately 1.5 V, the depletion layer that expands in the channel region from the first p-type semiconductor layer 111A shrinks, which allows flow of current in the channel region. Likewise, when the voltage of the second gate electrode 112B is higher than the voltage of the second electrode 109B by approximately 1.5 V, the depletion layer that expands in the channel region from the second p-type semiconductor layer 111B shrinks, which allows flow of current in the channel region. In this way, it is assumed that the threshold voltage for the first gate electrode 112A at which the depletion layer expanding in the channel region shrinks in the lower side of the first gate electrode 112A and thereby allowing flow of current in the channel region is a first threshold voltage, and that the threshold voltage for the second gate electrode 112B at which the depletion layer expanding in the channel region shrinks in the lower side of the second gate electrode 112B and thereby allowing flow of current in the channel region is a second threshold voltage.

Here, the first electrode 109A and the first switch terminal 103A are electrically connected to each other. Likewise, the second electrode 109B and the second switch terminal 103B, the first gate electrode 112A and the first control terminal 104A, the second gate electrode 112B and the second control terminal 104B are electrically connected to each other.

Next, operations performed by the semiconductor device 101 according to Embodiment 1 are described.

To facilitate explanation, it is assumed that the potential of the first switch terminal 103A is 0 V, the voltage between the second switch terminal 103B and the first switch terminal 103A is VS2S1, the voltage between the first control terminal 104A and the first switch terminal 103A is VG1, the voltage between the second control terminal 104B and the second switch terminal 103B is VG2, and that the current that flows from the second switch terminal 103B to the first switch terminal is IS2S1. VS2S1 corresponds to a drain voltage VDS in a normal FET, and IS2S1 corresponds to a drain current IDS.

Figure 3A:
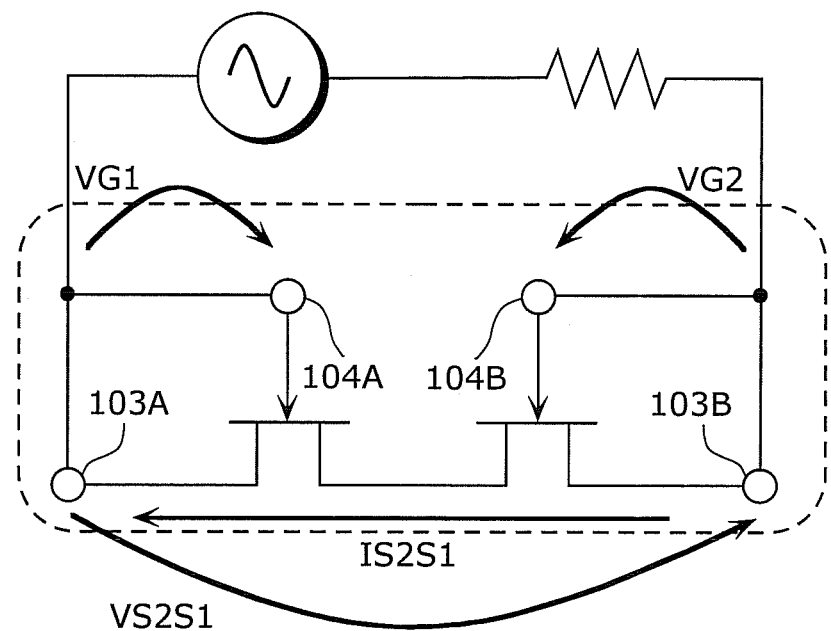
FIG. 3A is an illustration of operations performed by the semiconductor device in a blocking state according to Embodiment 1.
Figure 3B:
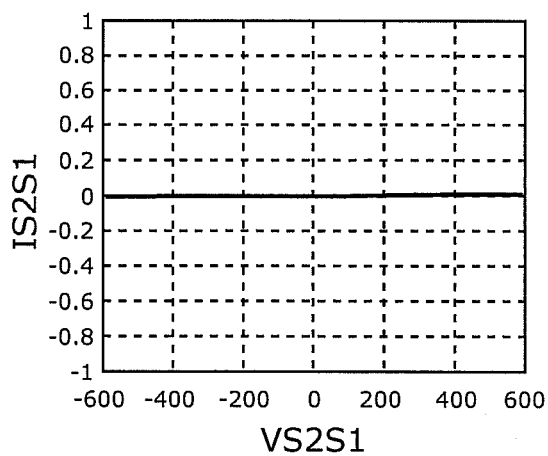
FIG. 3B is a diagram showing current-voltage characteristics of the semiconductor device in a blocking state according to Embodiment 1.

FIG. 3A is an illustration of operations performed by the semiconductor device in a blocking state according to Embodiment 1. As shown in FIG. 3A, it is assumed that VG1 and VG2 are voltages equal to or smaller than the first threshold voltage and the second threshold voltage, respectively. At this time, a depletion layer expands in the channel region from the lower portion of the first gate electrode 112A in FIG. 2, and likewise a depletion layer expands in the channel region from the lower portion of the second gate electrode 112B. Thus, the current that flows from the second switch terminal 103B to the first switch terminal 103A is blocked when VS2S1 is a positive high voltage, and the current that flows from the first switch terminal 103A to the second switch terminal 103B is blocked when VS2S1 is a negative high voltage. FIG. 3B is a diagram showing current-voltage (IS2S1-VS2S1) characteristics of the semiconductor device in a blocking state. As shown in the IS2S1-VS2S1 characteristics in FIG. 3B, a blocking state for blocking the bi-directional current is created.

Figure 4A:
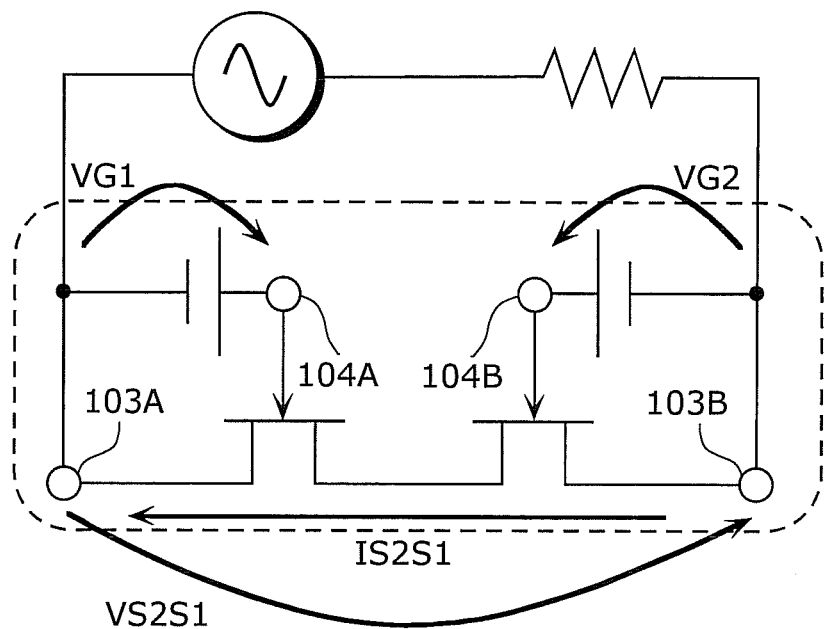
FIG. 4A is an illustration of operations performed by the semiconductor device in a conduction state according to Embodiment 1.
Figure 4B:
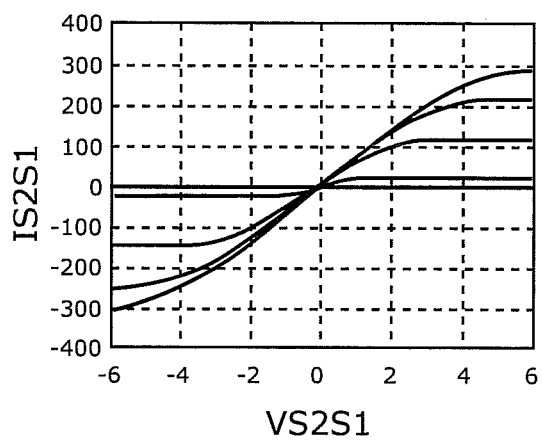
FIG. 4B is a diagram showing current-voltage characteristics of the semiconductor device in a conduction state according to Embodiment 1.

On the other hand, FIG. 4A is an illustration of operations performed by the semiconductor device in a conduction state. FIG. 4B is a diagram showing current-voltage characteristics of the semiconductor device in a conduction state. As shown in FIG. 4A, it is assumed that VG1 and VG2 are voltages higher than the first threshold voltage and the second threshold voltage, respectively, and the voltages are, for example, 4 V. At this time, the depletion layer to the channel layer does not expand from the lower portion of the first gate electrode 112A in FIG. 2. Likewise, a depletion layer to the channel layer does not expand from the lower portion of the second gate electrode 112B in FIG. 2. Thus, the channel region is not pinched off in both the lower portion of the first gate electrode 112A and the lower portion of the second gate electrode 112B. As a result, as shown in the IS2S1-VS2S1 characteristics in FIG. 4B, a conduction state for allowing bi-directional flow of current is created between the first switch terminal 103A and the second switch terminal 103B.

Figure 5A:
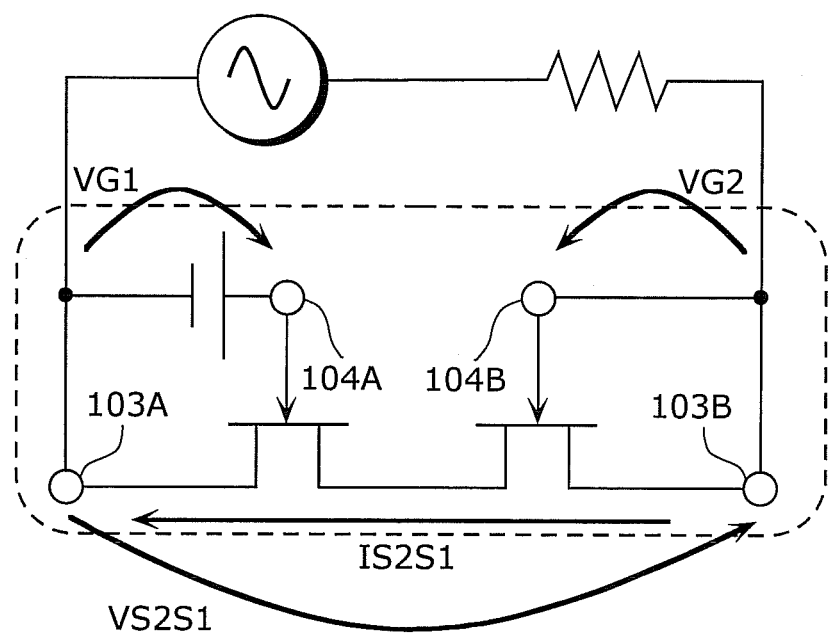
FIG. 5A is an illustration of operations performed by the semiconductor device in a reverse blocking state according to Embodiment 1.
Figure 5B:
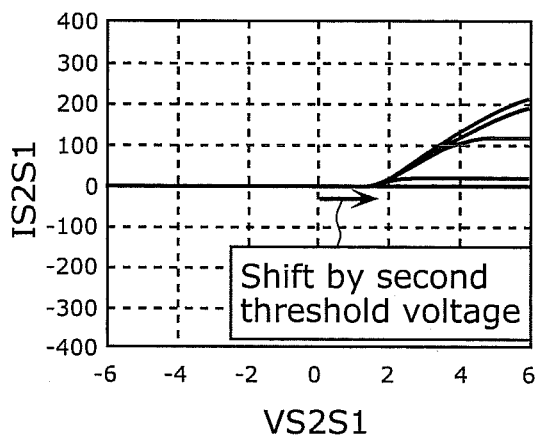
FIG. 5B is a diagram showing current-voltage characteristics of the semiconductor device in a reverse blocking state according to Embodiment 1.

Next, FIG. 5A is an illustration of operations performed by the semiconductor device in a reverse blocking state. FIG. 5B is a diagram showing current-voltage characteristics of the semiconductor device in a reverse blocking state. The following description is given assuming that VG1 is a voltage such as 4 V higher than the first threshold voltage, and VG2 is a voltage such as 0 V equal to or lower than the second threshold voltage. When VS2S1 is negative, that is, the voltage of the second switch terminal 103B is lower than the voltage of the first switch terminal 103A, a depletion layer expands from the lower portion of the second gate electrode 112B to the channel region. Thus, the current that flows from the second switch terminal 103B to the first switch terminal 103A is blocked. On the other hand, when VS2S1 is positive, that is, the voltage of the second switch terminal 103B is higher than the voltage of the first switch terminal 103A, a depletion layer does not expand from the lower portion of the second gate electrode 112B to the channel region when VS2S1 exceeds the second threshold voltage, for example, 1.5 V because the potential of the second gate electrode 104B is the same as the potential of the second electrode 103B. Thus, a current flows from the second electrode 103B to the first electrode 109A through the channel region. Accordingly, compared with the IS2S1-VS2S1 characteristics in a conduction state in FIG. 5A, the IS2S1-VS2S1 characteristics in FIG. 5B shows reverse blocking characterized in that VS2S1 is shifted by the second threshold voltage in the positive direction. In short, when VS2S1>1.5 V, IS2S1 begins to flow.

Figure 6A:
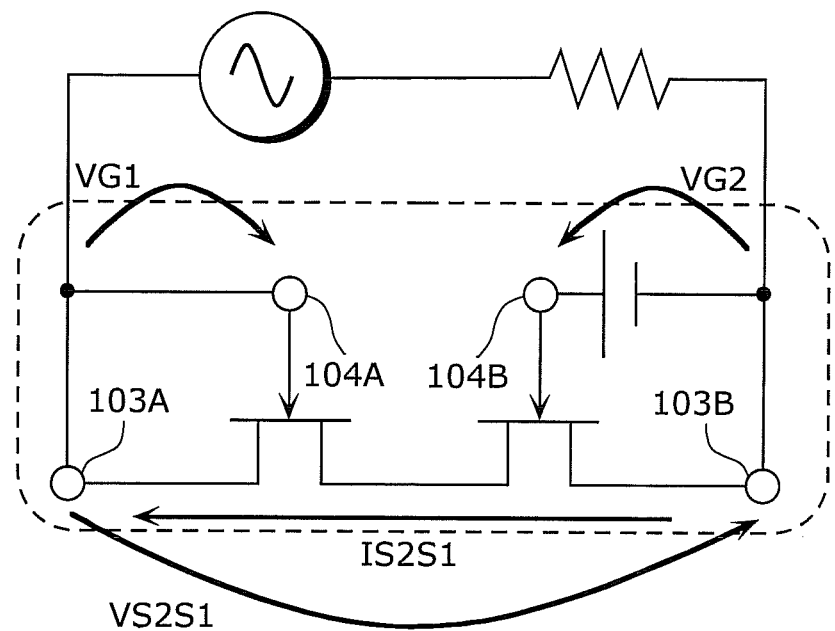
FIG. 6A is an illustration of operations performed by the semiconductor device in a reverse blocking state according to Embodiment 1.
Figure 6B:
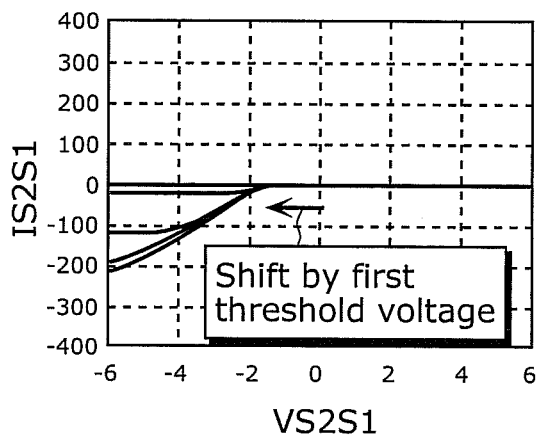
FIG. 6B is a diagram showing current-voltage characteristics of the semiconductor device in a reverse blocking state according to Embodiment 1.

Next, FIG. 6A is an illustration of operations performed by the semiconductor device in a reverse blocking state. FIG. 6B is a diagram showing current-voltage characteristics of the semiconductor device in a reverse blocking state. As shown in FIGS. 6A and 6B, when VG2 is a voltage such as 4 V that is higher than the second threshold voltage, and VG1 is a voltage such as 0 V that is equal to or lower than the first threshold voltage, the current-voltage characteristics are opposite to those shown in FIG. 5B. Here, IS2S1 is blocked when VS2S1 is positive, and IS2I1 begins to flow at the time when the absolute value of VS2S1 exceeds the first threshold voltage when VS2S1 is negative. Accordingly, compared with the IS2S1-VS2S1 characteristics in a conduction state in FIG. 6A, the IS2S1-VS2S1 characteristics in FIG. 6B shows reverse blocking characterized in that VS2S1 is shifted by the first threshold voltage in the negative direction. In short, IS2S1 begins to flow when VS2S1<1.5 V in the case where the first threshold voltage is 1.5 V.

As described above, the semiconductor device 101 operates in a reverse state (also referred to as a first operation mode), a conduction state (also referred to as a second operation mode), and a blocking state (also referred to as a third operation mode).

Here, the first operation mode is for performing reverse blocking for blocking flow of current from either one of the first electrode 109A or the second electrode 109B which is at a lower potential side to the other.

The second operation mode is a conduction state for allowing bi-directional flow of current between the first electrode 109A and the second electrode 109B.

The third operation mode is a blocking state for blocking any flow of current between the first electrode 109A and the second electrode 109B in both directions.

The control unit 102 controls switching between the first operation mode, the second operation mode, and the third operation mode. In particular, the control unit 102 causes the semiconductor device 101 to operate in the first operation mode in a transition period.

Figure 7:
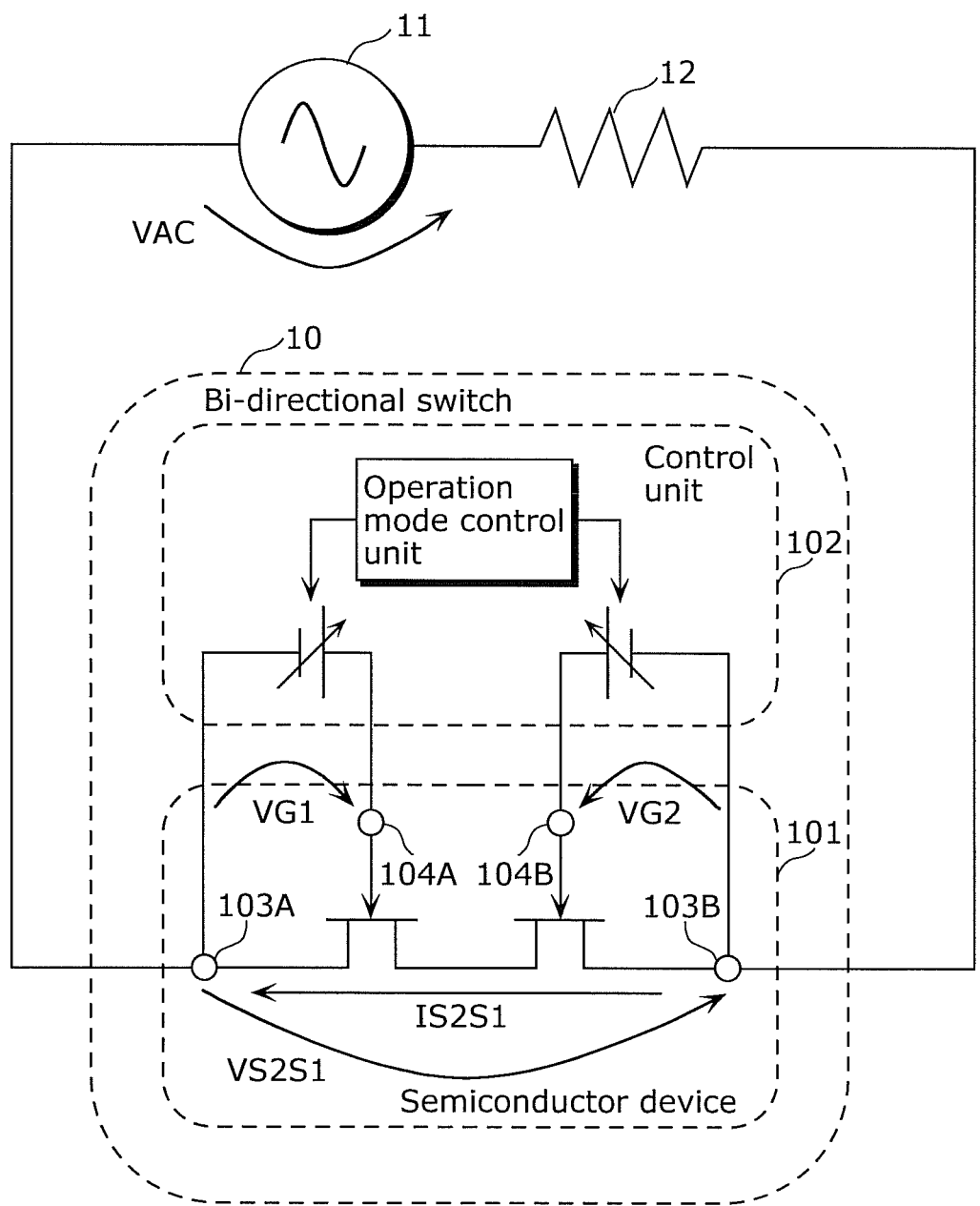
FIG. 7 shows an alternating-current closed circuit using a bi-directional switch according to Embodiment 1.

Here, descriptions are given of operations performed by the bi-directional switch 10 including, as shown in FIG. 1, the semiconductor device 101 that is capable of allowing bi-directional flow of current and the control unit 102 that performs switching between the first, second, and third operation modes. To facilitate understanding, a consideration is given of operations performed at the time when the bi-directional switch is activated in an assumed alternating-current closed circuit including an alternating-current power source 11, a load 12, and the bi-directional switch 10 as shown in FIG. 7.

Figure 8A:
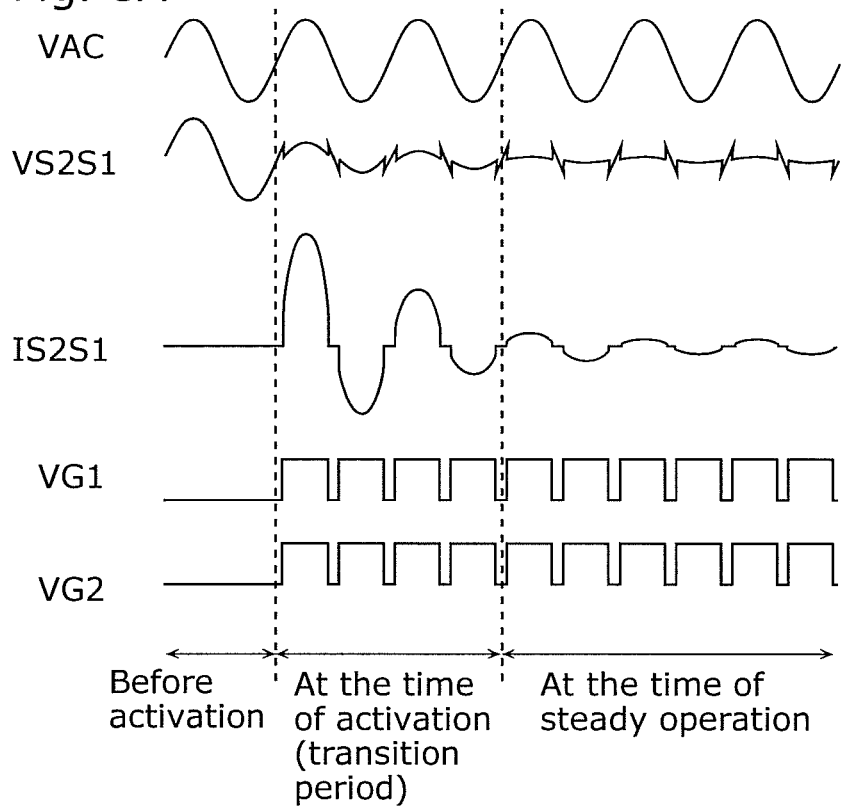
FIG. 8A is a diagram showing operation waveforms of an alternating-current closed circuit according to Embodiment 1, in the case where the alternating-current closed circuit is in a conduction state at the time of activation.
Figure 8B:
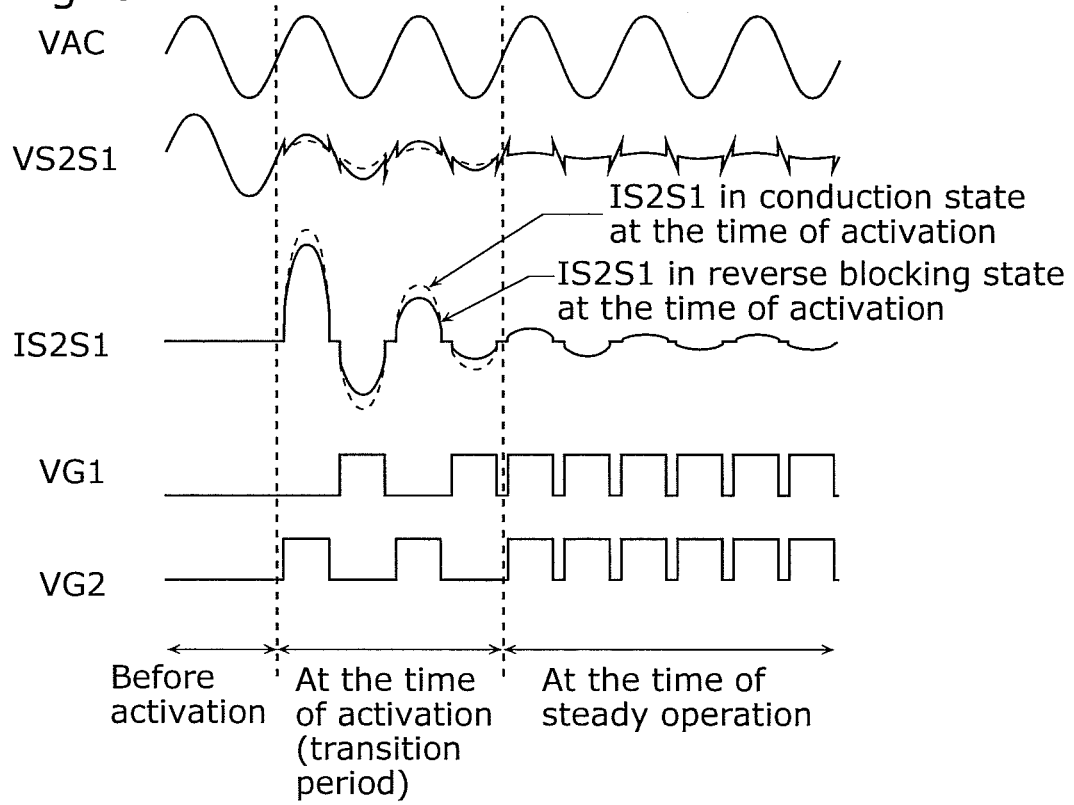
FIG. 8B is a diagram showing operation waveforms of an alternating-current closed circuit according to Embodiment 1, in the case where the alternating-current closed circuit is in a reverse blocking state at the time of activation.

FIG. 8A is a diagram showing operation waveforms in an alternating-current closed circuit in which the semiconductor device 101 is in a conduction state at the time of activation. FIG. 8B is a diagram showing operation waveforms in an alternating-current closed circuit in which the semiconductor device 101 is in a reverse blocking state at the time of activation. The control unit 102 is illustrated for comparison with FIG. 8B, although, in this embodiment, it does not control switching of operation modes as shown in FIG. 8A. Each of FIG. 8A and FIG. 8B shows waveforms in the alternating-current closed circuit shown in FIG. 7, more specifically, the waveforms of (i) an alternating-current voltage VAC before activation, at the time of activation, and during a steady operation, (ii) the second electrode voltage VS2S1 relative to the first electrode, (iii) the current IS2S1 that flows from the second electrode to the first electrode, (iv) the first gate voltage VG1, and (v) the second gate voltage VG2. FIG. 8A shows the waveforms in the case where the semiconductor device 101 is in a conduction state at the time of activation. FIG. 8B shows the waveforms in the case where the semiconductor device 101 is in a reverse blocking state in a period starting from the time of activation and lasting for the subsequent transition period, for example, corresponding to four-oscillation period (four cycles).

Here, when VS2S1 is positive, VS2S1 relative to IS2S1 and the on-resistance are higher in the reverse blocking state in each of FIG. 5A and FIG. 5B than in the conduction state in each of FIG. 4A and FIG. 4B. Accordingly, in the semiconductor device 101, the magnitude of the current that flows from the second switch terminal 103B to the first switch terminal 103A and the magnitude of the current that flows in the load are smaller in each of the reverse blocking state. In other words, as shown in FIG. 8B, it is possible to reduce the amount of an inrush current more significantly when the semiconductor device 101 is in a reverse blocking state at the time of activation than when the semiconductor device 101 is in a conduction state at the time of activation.

Figure 9A:
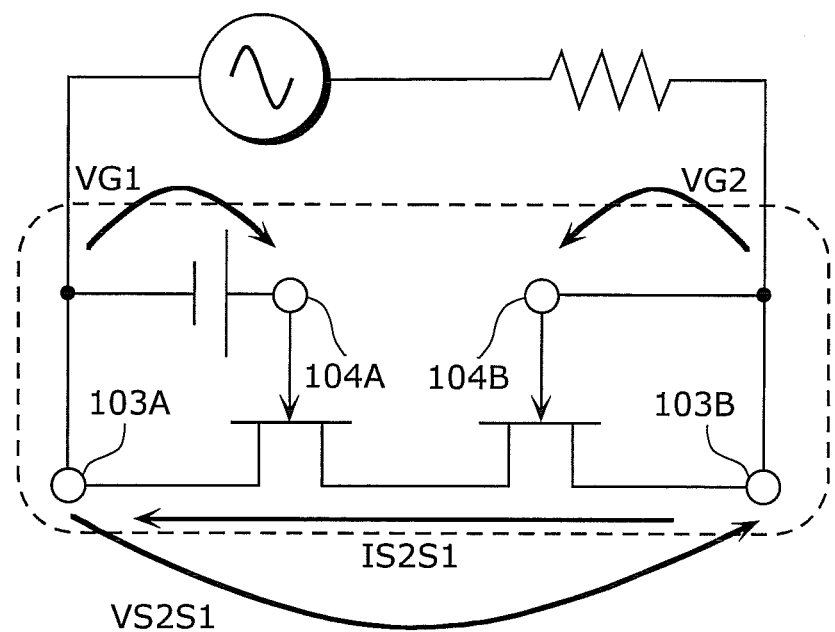
FIG. 9A is an illustration of reverse blocking performed by the semiconductor device according to Embodiment 1, in the case where 0 V is applied to a second gate electrode.
Figure 9B:
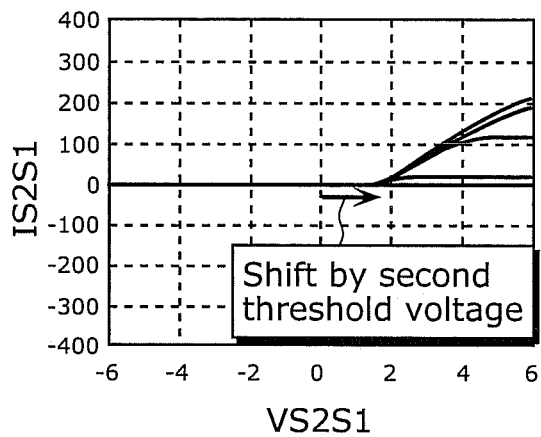
FIG. 9B is a diagram showing current-voltage characteristics at the time of reverse blocking performed by the semiconductor device according to Embodiment 1, in the case where 0 V is applied to the second gate electrode.
Figure 10A:
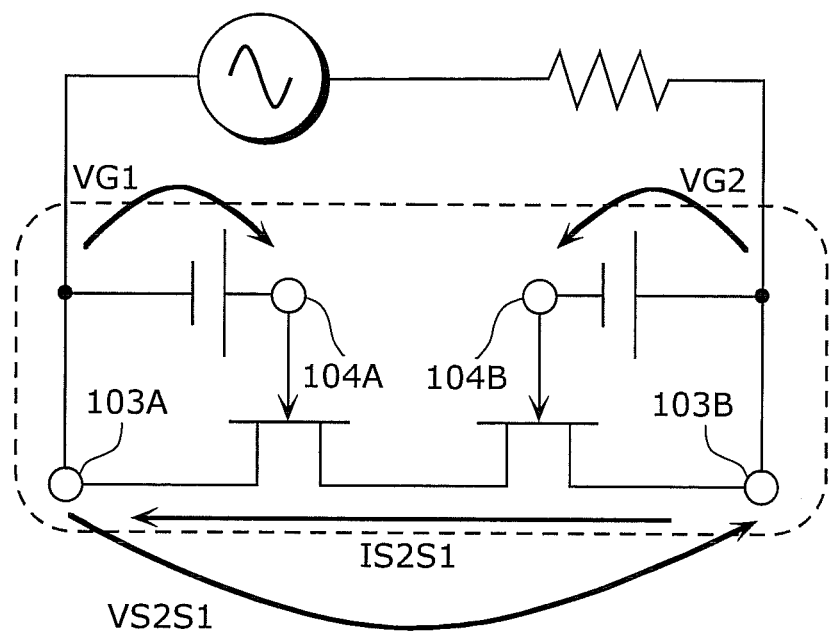
FIG. 10A is an illustration of reverse blocking performed by the semiconductor device according to Embodiment 1, in the case where a negative voltage is applied to the second gate electrode.
Figure 10B:
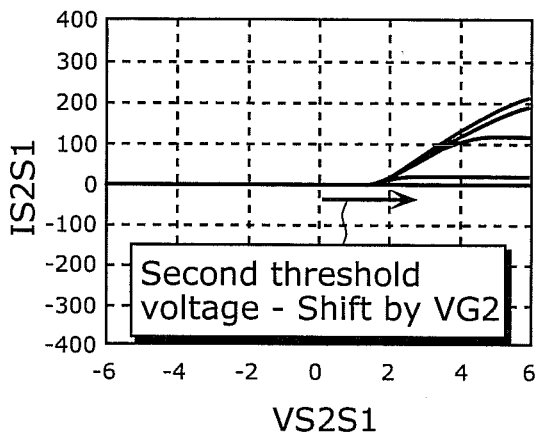
FIG. 10B is a diagram showing current-voltage characteristics at the time of reverse blocking performed by the semiconductor device according to Embodiment 1, in the case where a negative voltage is applied to the second gate electrode.

Although VG2=0 V when VS2S1 is positive in the bi-directional switch according to Embodiment 1, VG2<0 V is also possible. FIG. 9A is an illustration of a reverse blocking of the semiconductor device, in the case where 0 V is applied to the second gate electrode. FIG. 9B is a diagram showing current-voltage characteristics at the time of reverse blocking in FIG. 9A. FIG. 10A is an illustration of reverse blocking performed by the semiconductor device, in the case where a negative voltage is applied to the second gate electrode. FIG. 10B is a diagram showing current-voltage characteristics at the time of reverse blocking in FIG. 10A.

FIG. 9B and FIG. 10B show IS2S1-VS2S1 characteristics when VG2=0 V and VG2<0 V (for example, −1.5 V), respectively. As shown in FIG. 10A, in the case where a positive voltage is applied to VS2S1 in a state where VG2<0V, the voltage having a value obtained by adding the absolute value of VG2 to the second threshold voltage should be applied to the second control terminal 104B in order to prevent expansion of the depletion layer in the lower portion of the second gate electrode 112B. Accordingly, the IS2S1-VS2S1 characteristics in FIG. 10B show a shift by the absolute value of VG2 compared to the IS2S1-VS2S1 characteristics in FIG. 9B (a reverse blocking state), and show a shift corresponding to a value obtained by adding the absolute value of VG2 to the second threshold voltage, compared to the IS2S1-VS2S1 characteristics in FIG. 4B (a conduction state). Accordingly, the on-resistance is further increased, which makes it possible to further reduce the amount of an inrush current. Alternatively, it is also possible that VG1<0 V also in a reverse blocking state in the case where VS2S1 is negative. A method of driving a bi-directional switch according to this embodiment includes: (i) determining whether or not a potential of the first electrode is higher than a potential of the second electrode, in a transition period corresponding to a transition state at a time when the semiconductor device is activated; (ii) applying, to the first gate electrode, a voltage that is relative to the potential of the first electrode and lower than a first threshold voltage, and (i) applying, to the second gate electrode, a voltage that is relative to the potential of the second electrode and higher than a second threshold voltage, when the potential of the first electrode is higher than the potential of the second electrode in a transition period corresponding to a transition state at a time when the semiconductor device is activated; and apply, to the first gate electrode, a voltage that is relative to the potential of the first electrode and higher than the first threshold voltage, and apply, to the second gate electrode, a voltage that is relative to the potential of the second electrode and lower than a second threshold voltage, when the potential of the first electrode is lower than the potential of the second electrode in the transition period.

Variation of Embodiment 1

Figure 11:
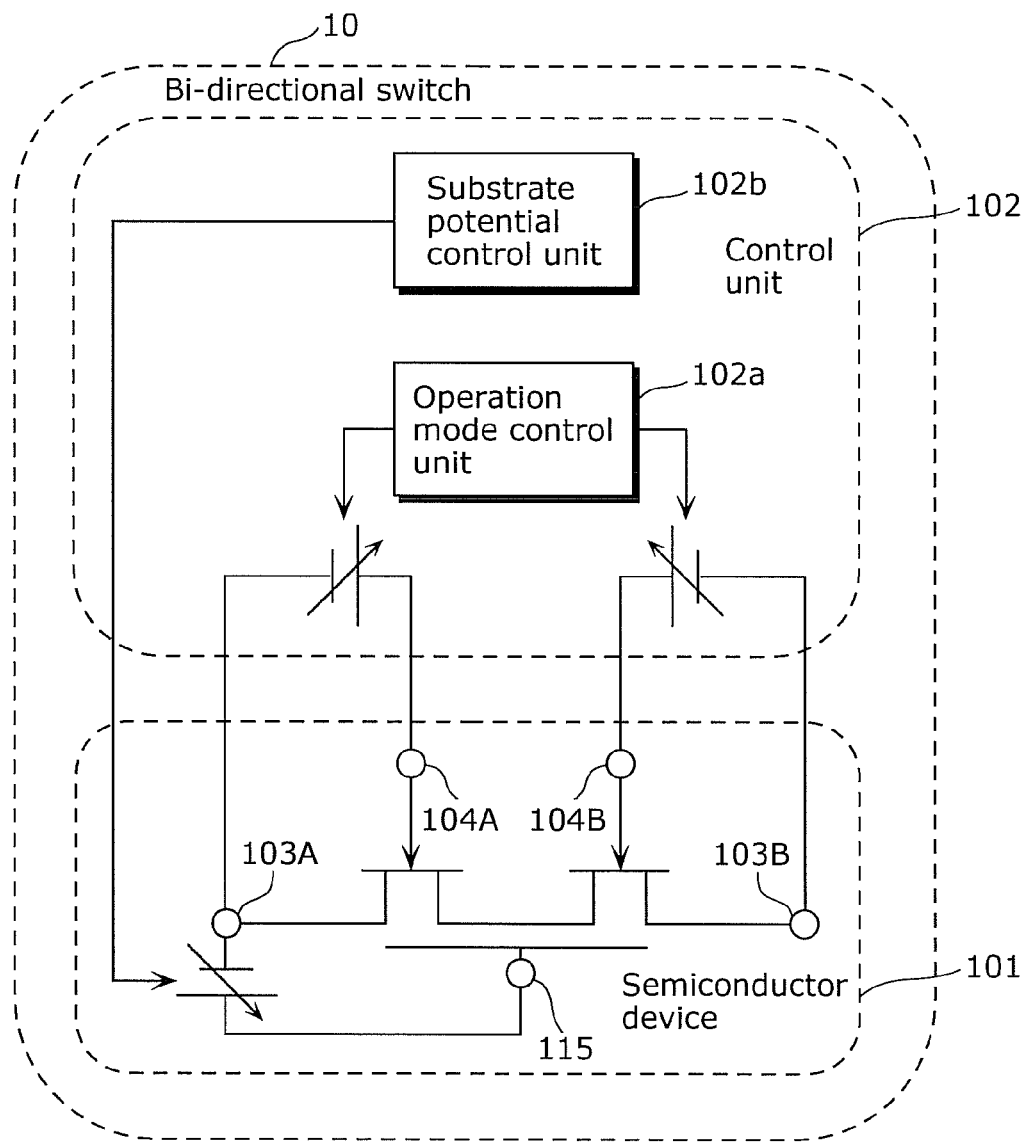
FIG. 11 is a block diagram showing an exemplary structure of a bi-directional switch according to Variation of Embodiment 1.
Figure 12:
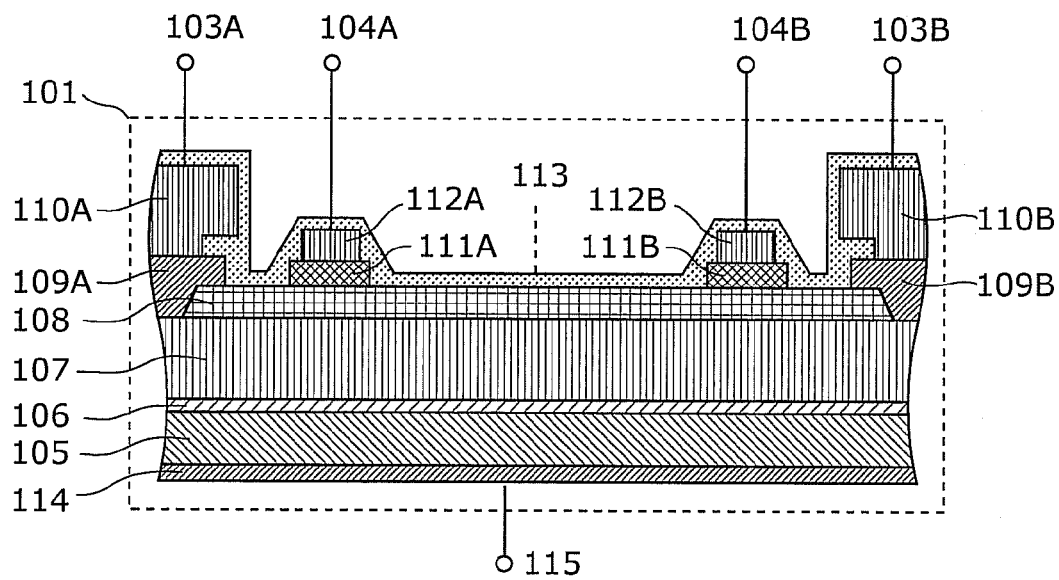
FIG. 12 is a cross-sectional view of a semiconductor device according to Variation of Embodiment 1.

Variation of Embodiment 1 is described with reference to the drawings. FIG. 11 is a block diagram showing a structure of a bi-directional switch 10 in this variation of Embodiment 1. FIG. 12 is a cross-sectional view of the semiconductor device 101 in this variation of Embodiment 1. The same structural elements as in Embodiment 1 are assigned with the same numerical references, and no detailed descriptions thereof are repeated.

As shown in FIG. 12, the semiconductor device 101 according to this variation of Embodiment 1 has a back surface electrode 114 connected to a substrate terminal 115. As shown in FIG. 11, the control unit 102 further includes a substrate potential control unit 102b which controls the potential of the substrate terminal 115 for the semiconductor device 101, in addition to the operation mode control unit 102a which controls the first control terminal 104A and the second control terminal 104B of the semiconductor device 101.

Here, a description is given of operations performed by the semiconductor device 101 when the substrate potential control unit 102b controls the substrate voltage.

Figure 13:
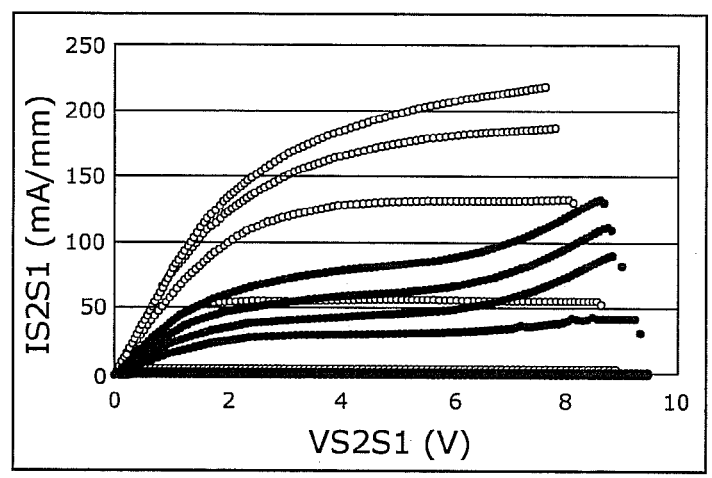
FIG. 13 is current-voltage characteristics of the semiconductor device according to Variation of Embodiment 1, in the case where a substrate voltage is changed.

FIG. 13 shows an example of IS2S1-VS2S1 characteristics in a conduction state created when the substrate voltage is changed. When a negative voltage (for example, −100 V) relative to the first switch terminal 103A is applied as a substrate voltage to the substrate terminal 115, the on-resistance is high compared in the case where the substrate voltage is 0 V. Accordingly, it is possible to achieve a bi-directional switch that reduces the amount of an inrush current.

Embodiment 2

Figure 14:
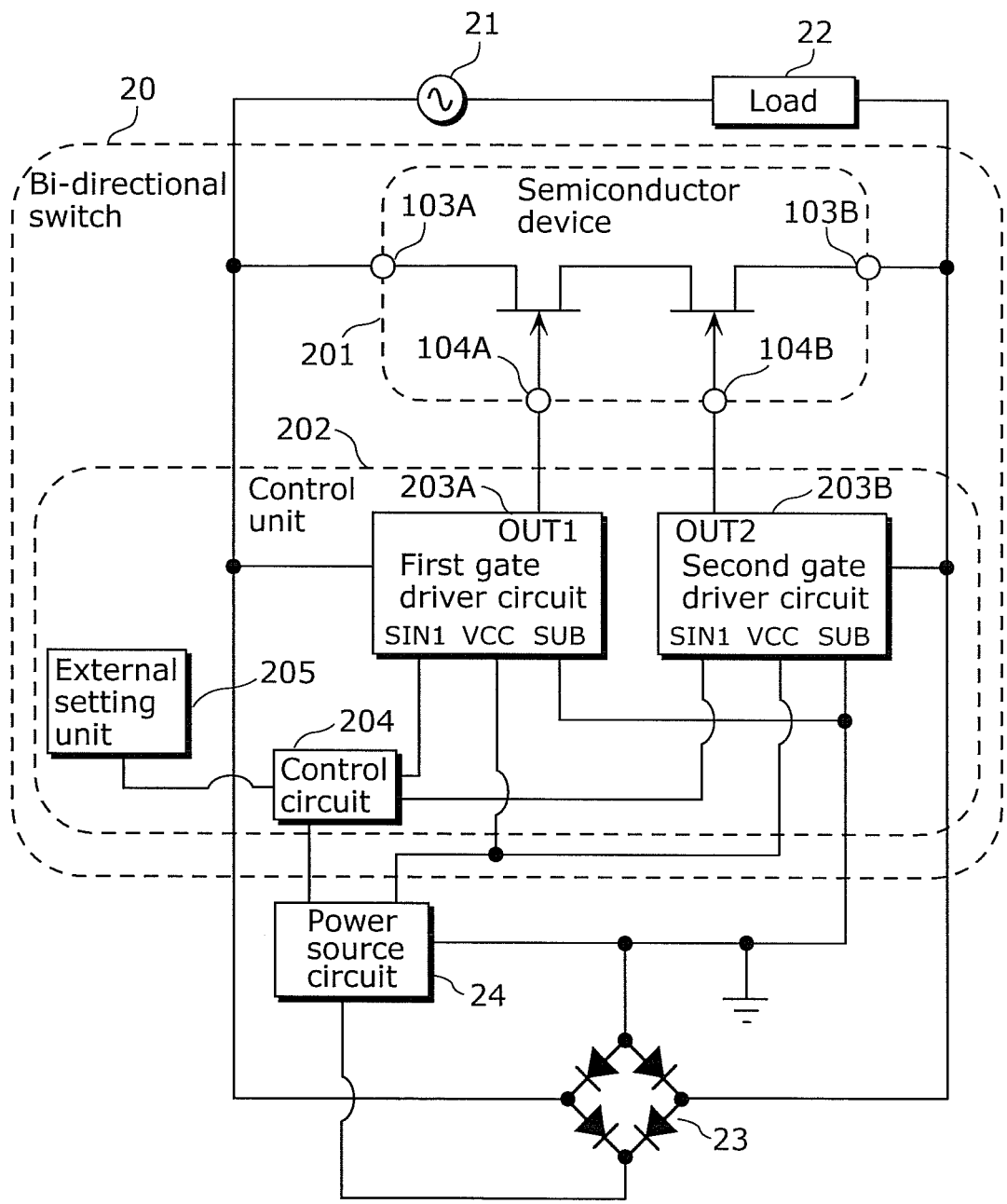
FIG. 14 is a block diagram showing an exemplary structure of an alternating-current two-wire switch according to Embodiment 2.

An alternating-current two-wire switch according to Embodiment 2 is described with reference to the drawings. FIG. 14 is a block diagram showing an exemplary structure of the alternating-current two-wire switch according to Embodiment 2. This alternating-current two-wire switch includes: a commercial-use alternating-current power source 21; a load 22 such as a lighting apparatus; a bi-directional switch 20 that is an alternating-current switch connected between the commercial-use alternating-current power source 21 and the load 22 such as an lighting apparatus, and includes a semiconductor device 201 capable of allowing bi-directional flow of current and a control unit 202; a full wave rectifier 23; and a power source circuit 24.

The bi-directional switch 20 includes the semiconductor device 201 and the control unit 202.

Here, the semiconductor device 201 is equivalent to the semiconductor device 101 according to Embodiment 1, and includes a first switch terminal 103A, a second switch terminal 103B, a first control terminal 104A, and a second control terminal 104B.

The control unit 202 includes a first gate driver circuit 203A, a second gate driver circuit 203B, and a control circuit 204 that provides a control signal to the first gate driver circuit 203A and the second gate driver circuit 203B.

The commercial-use power source 21, the load 22, and the semiconductor device 201 in the bi-directional switch 20 are connected in series to form a closed circuit.

The full wave rectifier 23 is connected between the first switch terminal 103A and the second switch terminal 103B in the semiconductor device 201, and is a bridge diode or the like that performs full wave rectification of alternating-current power voltage output from the commercial-use alternating-current power source 21.

The power source circuit 24 is intended to smooth the voltage after the full wave rectification that is output from the full wave rectifier 23, and supplies a direct-current power voltage. The direct-current power voltage necessary for the first gate driver circuit 203A, the second gate driver circuit 203B, and the control circuit 204 is supplied from the power source circuit 24.

The control unit 202 includes the first gate driver circuit 203A, the second gate driver circuit 203B, and the control circuit 204. The first gate driver circuit 203A outputs a voltage higher or lower than a first threshold voltage to the first control terminal 104A through an output terminal OUT 1.

Likewise, the second gate driver circuit 203B outputs a voltage higher or lower than a second threshold voltage to the second control terminal 104B through an output terminal OUT 2. The state of either an output voltage or an output current from each of the output terminal OUT 1 and the output terminal OUT 2 is determined according to a corresponding one of signals of an input terminal SIN 1 and an input terminal SIN 2 provided from the control circuit 204.

More specifically, an external setting unit 205 transfers, to the control circuit 204, a signal indicating whether or not to supply electric power from the commercial-use alternating-current power source 21 to the load 22. According to the transferred signal, the control circuit 204 outputs a control signal to the input terminal SIN 1 of the first gate driver circuit 203A and the input terminal SIN 2 of the second gate driver circuit 203B so that the semiconductor device 201 enters into one of the blocking state, conduction state, and reverse blocking state.

In other words, when causing the semiconductor device 201 to enter into a blocking state, the control circuit 204 outputs a control signal to the input terminals SIN 1 and SIN 2 of the first and second gate driver circuits so that the first gate driver circuit 203A outputs a voltage lower than the first threshold voltage and the second gate driver circuit 203B outputs a voltage lower than the second threshold voltage.

Furthermore, when causing the semiconductor device 201 to enter into a conduction state, the control circuit 204 outputs a control signal to the input terminals SIN 1 and SIN 2 of the first and second gate driver circuits so that the first gate driver circuit 203A outputs a voltage higher than the first threshold voltage and the second gate driver circuit 203B outputs a voltage higher than the second threshold voltage.

Furthermore, when causing the semiconductor device 201 to enter into a reverse blocking state in the case where the potential of the second switch terminal 103B is higher than the potential of the first switch terminal 103A, the control circuit 204 outputs a control signal to the input terminals SIN 1 and SIN 2 of the first and second gate driver circuits so that the first gate driver circuit 203A outputs a voltage higher than the first threshold voltage and the second gate driver circuit 203B outputs a voltage lower than the second threshold voltage. In contrast, when causing the semiconductor device 201 to enter into a reverse blocking state in the opposite case where the potential of the second switch terminal 103B is lower than the potential of the first switch terminal 103A, the control circuit 204 outputs a control signal to the input terminals SIN 1 and SIN 2 of the first and second gate driver circuits so that the first gate driver circuit 203A outputs a voltage lower than the first threshold voltage and the second gate driver circuit 203B outputs a voltage higher than the second threshold voltage.

The semiconductor device 201 operates in a state in which the on-resistance is high, when the semiconductor device 201 performs reverse blocking in a period that starts when the aforementioned alternating-current two-wire switch is activated and lasts during an oscillation period corresponding to at least one oscillation cycle. Accordingly, it is possible to reduce the amount of an inrush current at the time when the alternating-current two-wire switch is activated.

Here, the alternating-current two-wire switch according to Embodiment 2 may be configured to include the normally-off type semiconductor device 201, and apply a voltage having the same potential as the potential of the first switch terminal 103A when the first gate driver circuit 203A outputs a voltage lower than the first threshold voltage, and outputs a voltage having the same potential as the potential of the second switch terminal 103B when the second gate driver circuit 203B outputs a voltage lower than the second threshold voltage.

Alternatively, the alternating-current two-wire switch according to Embodiment 2 may be configured to apply a negative voltage relative to the potential of the first switch terminal 103A when the first gate driver circuit 203A outputs a voltage lower than the first threshold voltage, and apply a negative voltage relative to the potential of the second switch terminal 103B when the second gate driver circuit 203B outputs the voltage lower than the second threshold voltage.

Variation of Embodiment 2

Figure 15:
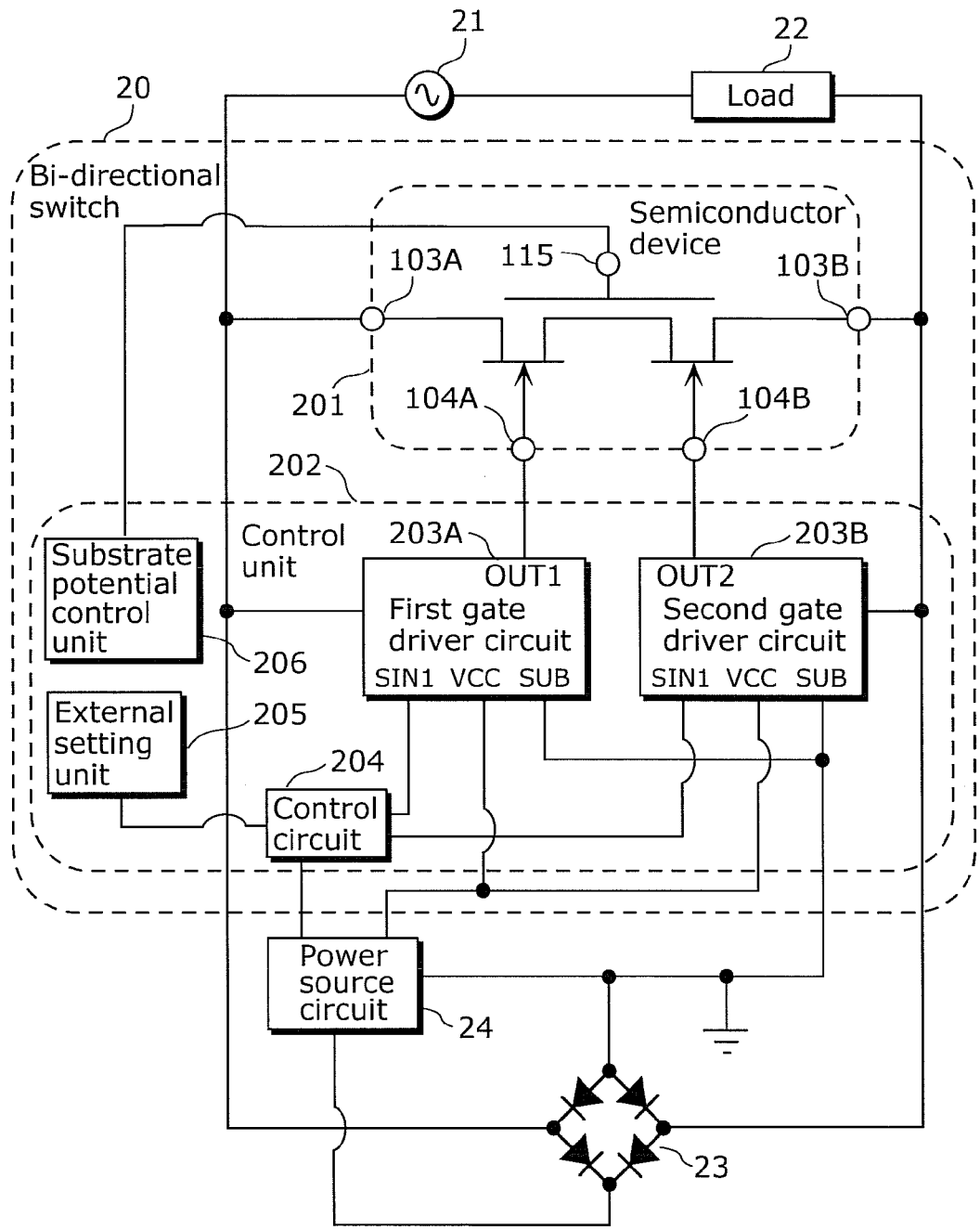
FIG. 15 is a block diagram showing a variation of the alternating-current two-wire switch according to Embodiment 2.

An alternating-current two-wire switch according to Variation of Embodiment 2 is described with reference to the drawings. FIG. 15 is a block diagram of the alternating-current two-wire switch according to Variation of Embodiment 2. In the alternating-current two-wire switch according to this variation of Embodiment 2, the semiconductor device 201 has a back surface electrode 114 connected to a substrate terminal 115. Furthermore, the control unit 202 includes a substrate potential control unit 206 that controls the potential of the substrate terminal 115.

As with the IS2S1-VS2S1 characteristics of the semiconductor device according to Variation of Embodiment 1, the semiconductor device 201 operates in a state where the on-resistance is large, in the case where a negative voltage is applied as a substrate voltage. Accordingly, it is possible to reduce the amount of an inrush current at the time when the alternating-current two-wire switch is activated.

Embodiment 3

Figure 16:
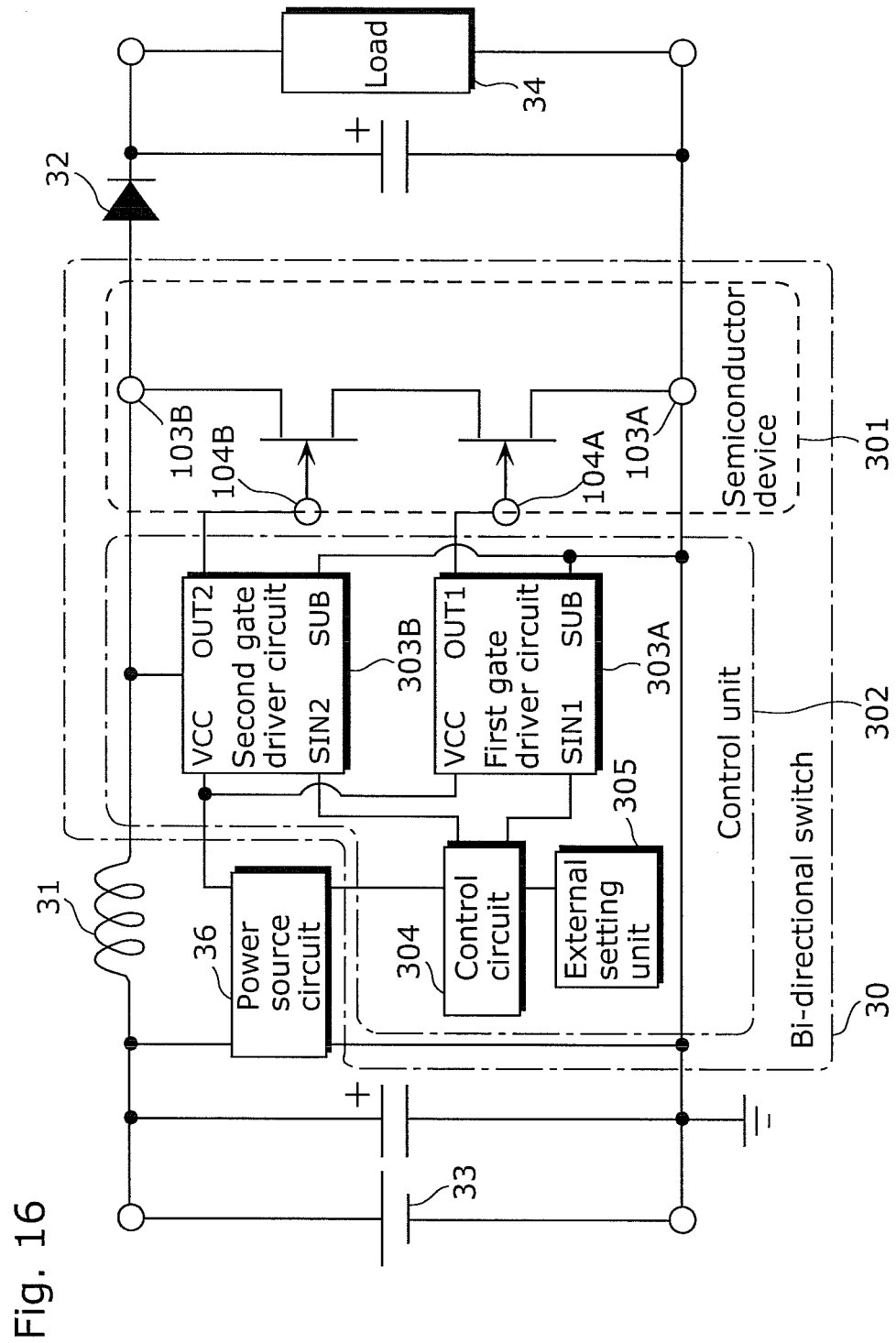
FIG. 16 is a block diagram showing an exemplary structure of a switching power source circuit according to Embodiment 3.

A switching power source circuit according to Embodiment 3 is described with reference to the drawings. FIG. 16 is a circuit diagram showing an exemplary structure of the switching power source circuit according to Embodiment 3. An inductor 31 for accumulating energy and a rectifier diode 32 are connected in series between an input power source 33 and a load 34. A bi-directional switch 30 including a semiconductor device 301 and a control unit 302 is connected between the inductor 31 and the rectifier diode 32. A first switch terminal 103A of the semiconductor device 301 is connected between the inductor 31 and the rectifier diode 32, and a second switch terminal 103B of the semiconductor device 301 is connected to a GND potential.

Here, the semiconductor device 301 is equivalent to the semiconductor device 101 according to Embodiment 1, and includes a first switch terminal 103A, a second switch terminal 103B, a first control terminal 104A, and a second control terminal 104B.

The control unit 302 includes a first gate driver circuit 303A, a second gate driver circuit 303B, and a control circuit 304 that provides a control signal to the first gate driver circuit 303A and the second gate driver circuit 303B.

The power source circuit 36 is a circuit which receives supply of power from the input power source 33, and supplies a direct-current voltage. The direct-current power voltage necessary for the first gate driver circuit 303A, the second gate driver circuit 303B, and the control circuit 304 is supplied from the power source circuit 36.

The control unit 302 includes the first gate driver circuit 303A, the second gate driver circuit 303B, and the control circuit 304. The first gate driver circuit 303A outputs a voltage higher or lower than a first threshold voltage to the first control terminal 104A through an output terminal OUT 1. Likewise, the second gate driver circuit 303B outputs a voltage higher or lower than a second threshold voltage to the second control terminal 104B through an output terminal OUT 2. The state of either an output voltage or an output current from each of the output terminals OUT 1 and OUT 2 is determined according to a corresponding one of signals of input terminals SIN 1 and SIN 2 provided from the control circuit 304.

More specifically, an external setting unit 305 provides the control circuit 304 with a signal indicating whether or not to supply power to the load 34. According to the transferred signal, the control circuit 304 outputs a control signal to the input terminal SIN 1 of the first gate driver circuit 303A and the input terminal SIN 2 of the second gate driver circuit 303B so that the semiconductor device 301 enters into one of the blocking state, conduction state, and reverse blocking state.

The semiconductor device 301 operates in a state in which the on-resistance is high, when the semiconductor device 301 performs reverse blocking in a period that starts when the aforementioned switching power source circuit is activated and lasts during an oscillation period corresponding to at least one oscillation cycle. Thus, it is possible to reduce the amount of an inrush current at the time of the activation. In this way, it is possible to reduce the loads on the inductor 31 for accumulating energy, the rectifier diode 32, and the like.

Embodiment 3 is described taking an example of using a voltage-increasing chopper circuit as the switching power source circuit. However, it is also possible to implement any other switching power source circuit that includes an inductor for accumulating energy as a power source device and a rectifier diode, performs switching for allowing bi-directional flow of current to perform energy conversion, and thereby reducing the amount of an inrush current as in the earlier-described embodiments.

Here, the switching power source circuit according to Embodiment 3 may be configured to apply a voltage having the same potential as the potential of the first switch terminal 103A when the first gate driver circuit 303A outputs a voltage lower than the first threshold voltage, and apply a voltage having the same potential as the potential of the second switch terminal 103B when the second gate driver circuit 303B outputs a voltage lower than the second threshold voltage.

Alternatively, the switching power source circuit according to Embodiment 3 may be configured to apply a negative voltage relative to the potential of the first switch terminal 103A when the first gate driver circuit 303A outputs a voltage lower than the first threshold voltage, and apply a negative voltage relative to the potential of the second switch terminal 103B when the second gate driver circuit 303B outputs the voltage lower than the second threshold voltage.

Variation of Embodiment 3

Figure 17:
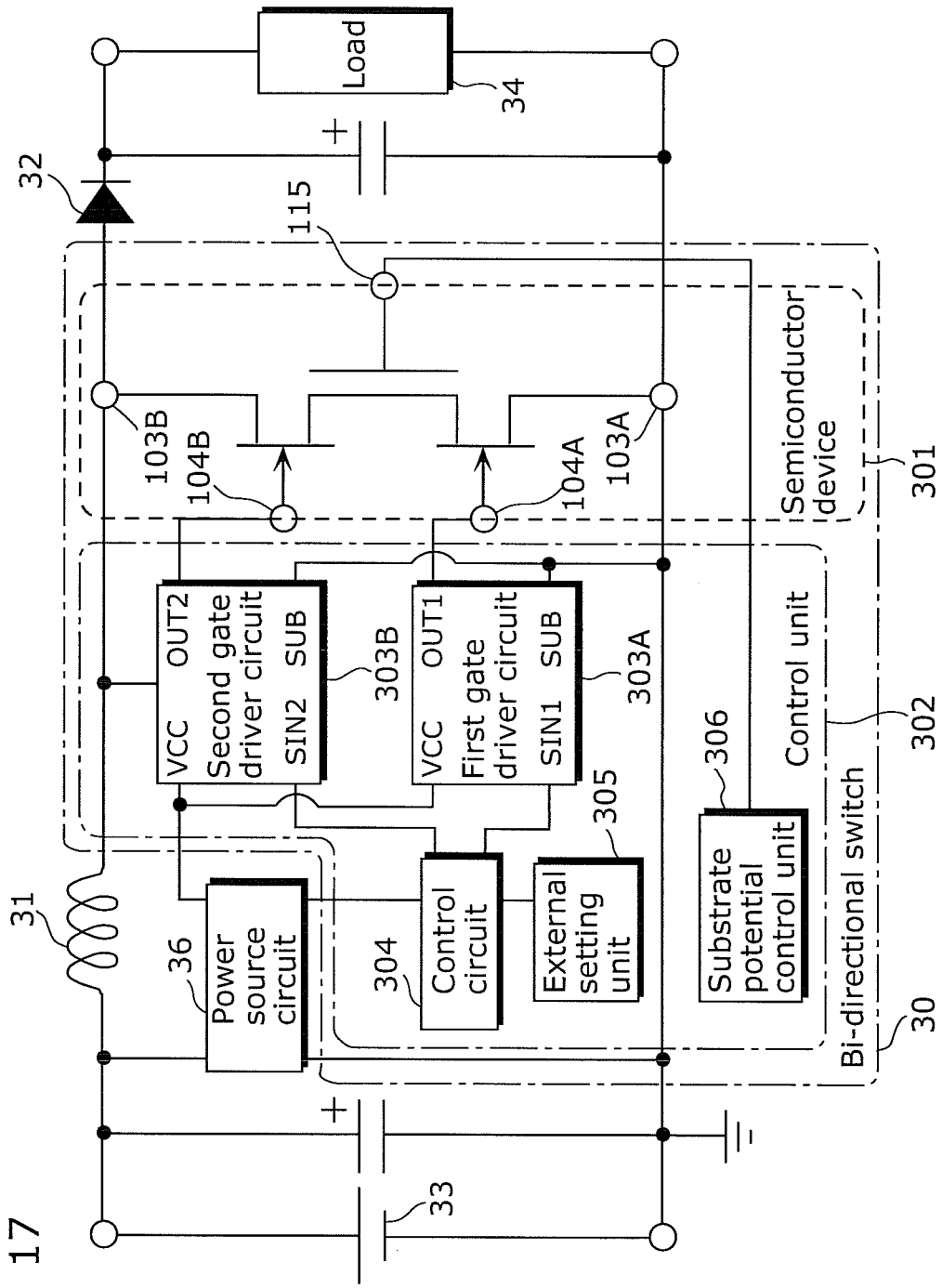
FIG. 17 is a block diagram showing a variation of a switching power source circuit according to Embodiment 3.
Figure 18:
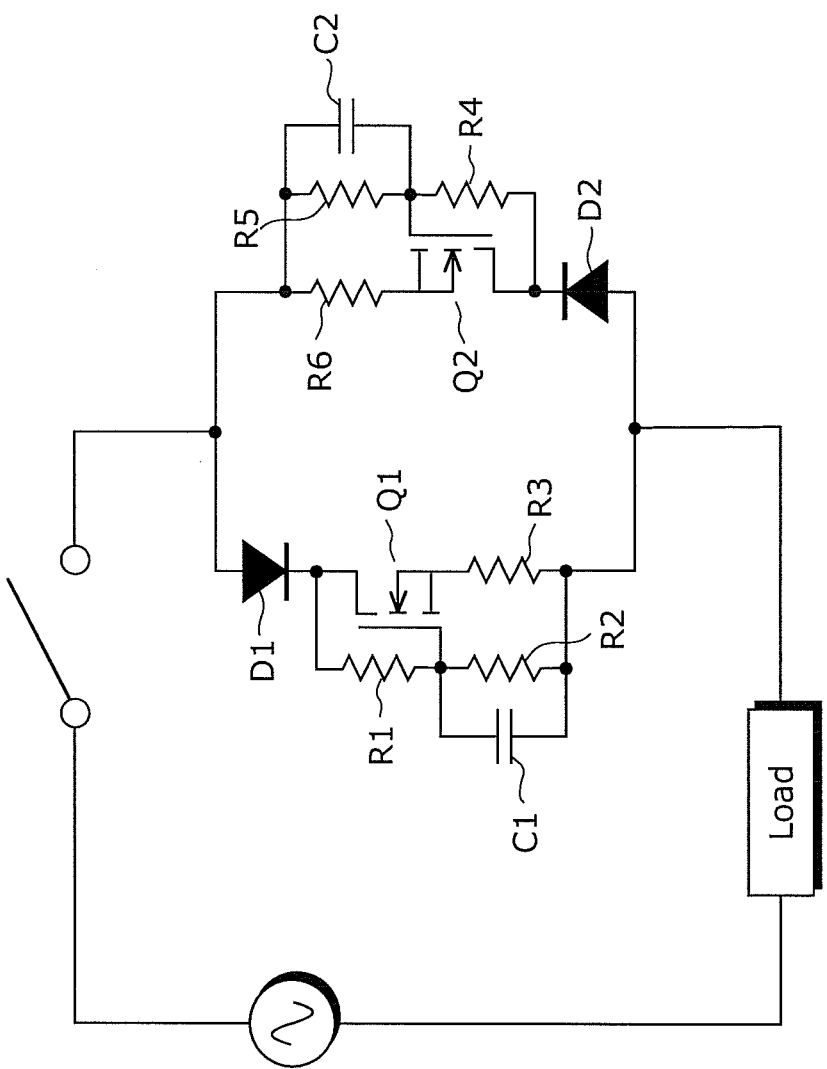
FIG. 18 is a diagram showing a structure of a device including a bi-directional switch, a power source, and a load according to the conventional art.

A switching power source circuit according to Embodiment 3 is described with reference to the drawings. FIG. 17 is a block diagram of the switching power source circuit according to Variation of Embodiment 3. In the switching power source circuit according to Variation of Embodiment 3, the semiconductor device 301 has a back surface electrode 114 connected to a substrate terminal 115. Furthermore, the control unit 302 includes a substrate potential control unit 306 that controls the potential of the substrate terminal 115.

As with the IS2S1-VS2S1 characteristics of the semiconductor device according to Variation of Embodiment 1, the semiconductor device 301 operates in a state where the on-resistance is large, in the case where a negative voltage is applied as a substrate voltage. Accordingly, it is possible to reduce the amount of an inrush current at the time when the switching power source circuit is activated.

The present invention has been described above taking exemplary embodiments in each of which each of the first and second p-type semiconductor layers is present between a corresponding one of the first and second gate electrodes and the second semiconductor layer in the semiconductor device in the corresponding embodiment. For example, it is also good to form an insulating layer instead of a p-type semiconductor layer below the gate electrode to configure an insulating gate as the gate structure of the semiconductor device. Alternatively, it is also good to form a junction gate in which the gate electrode and the semiconductor stack forms a Schottky junction without forming such a p-type semiconductor layer below the gate electrode.

Although the substrate in the semiconductor device of the bi-directional switch according to each of the embodiments in the present invention is an Si substrate, the substrate for use in the present invention is not limited to such an Si substrate. A substrate for use in the present invention may be a silicon carbide (Si) substrate, a sapphire substrate, or any other substrate that can be used to form a nitride semiconductor.

Although only some exemplary embodiments of the present invention have been described in detail above, those skilled in the art will readily appreciate that many modifications are possible in the exemplary embodiments without materially departing from the novel teachings and advantageous effects of the present invention. Accordingly, all such modifications are intended to be included within the scope of the present invention.

INDUSTRIAL APPLICABILITY

A bi-directional switch according to the present invention, each of an alternating-current two-wire switch, and a switching power source circuit each using the bi-directional switch is capable of reducing the amount of an inrush current at the time of activation without increasing the number of components. Accordingly, the present invention is applicable to a bi-directional switch, an alternating-current two-wire switch, and a switching power source circuit capable of reducing the electromagnetic interference to nearby electric appliances and reducing the loads on the electric devices themselves.

What is claimed is:

1. A bi-directional switch comprising a semiconductor device and a control unit wherein: said semiconductor device includes: a semiconductor stack formed on a substrate, having a channel region, and including one of (i) a nitride semiconductor and (ii) a semiconductor including silicon carbide; a first electrode and a second electrode formed at an interval on said semiconductor stack; a first gate electrode formed between said first electrode and said second electrode; and
   a second gate electrode formed between said first gate electrode and said second electrode, and said control unit is configured to: apply, to said first gate electrode, a voltage that is relative to a potential of said first electrode and lower than a first threshold voltage of the first gate electrode, and apply, to said second gate electrode, a voltage that is relative to a potential of said second electrode and higher than a second threshold voltage of the second gate electrode, when the potential of said first electrode is higher than the potential of said second electrode in a transition period corresponding to a transition state after said semiconductor device starts being activated; and apply, to said first gate electrode, a voltage that is relative to a potential of said first electrode and higher than the first threshold voltage, and apply, to said second gate electrode, a voltage that is relative to a potential of said second electrode and lower than a second threshold voltage, when the potential of said first electrode is lower than the potential of said second electrode in the transition period.

2. The bi-directional switch according to claim 1, wherein: said semiconductor device operates in a first operation mode, a second operation mode, and a third operation mode, said control unit is configured to control switching between the first, second, and third operation modes, the first operation mode is for performing reverse blocking for blocking a current flow from one of said first electrode and said second electrode to the other, the one of said first electrode and said second electrode having a potential lower than a potential of the other, the second operation mode is a conduction state in which a current flows bi-directionally between said first electrode and said second electrode, the third operation mode is a blocking state in which any current does not flow between said first electrode and said second electrode in both directions, and said control unit is configured to make said semiconductor device into the first operation mode in the transition period.

3. The bi-directional switch according to claim 2, wherein: said semiconductor device is a normally-off type semiconductor device, and in the first operation mode, said control unit is configured to apply a voltage to one of said first gate electrode and said second gate electrode, the voltage having a same potential as the potential of the other one of said first electrode and said second electrode which has the higher potential, and the one of said first gate electrode and said second gate electrode being located at a side of the other which has the higher potential.

4. The bi-directional switch according to claim 2, wherein, in the first operation mode, said control unit is configured to apply a negative voltage to one of said first gate electrode and said second gate electrode, the negative voltage being relative to the potential of the other one of said first electrode and said second electrode which has the higher potential, and the one of said first gate electrode and said second gate electrode being located at a side of the other which has the higher potential.

5. The bi-directional switch according to claim 1, wherein/said semiconductor device includes a substrate electrode, and said control unit includes a substrate potential control unit configured to control a potential of said substrate electrode.

6. The bi-directional switch according to claim 1, comprising:
   a first semiconductor layer formed between said first gate electrode and said semiconductor stack, and forms a PN junction with said semiconductor stack; and
   a second semiconductor layer formed between said second gate electrode and said semiconductor stack, and forms a PN junction with said semiconductor stack.

7. The bi-directional switch according to claim 1, comprising
   an insulating layer below each of said first gate electrode and said second gate electrode.

8. The bi-directional switch according to claim 1, wherein each of said first gate electrode and said second gate electrode forms a Schottky junction with said semiconductor stack.

9. The bi-directional switch according to claim 1, wherein said substrate is a silicon substrate.

10. The bi-directional switch according to claim 1, wherein said substrate is a silicon carbide substrate.

11. The bi-directional switch according to claim 1, wherein said substrate is a sapphire substrate.

12. An alternating-current two-wire switch which is connected between an alternating-current power source and a load, said alternating-current two-wire switch comprising
  a bi-directional switch connected in series with said alternating-current power source and said load such that said bi-directional switch, said alternating-current power source, and said load form a closed circuit,
  wherein said bi-directional switch is the bi-directional switch according to claim 1.

13. The alternating-current two-wire switch according to claim 12, further comprising: a full wave rectifier connected between said first electrode and said second electrode to perform full wave rectification of an alternating-current power voltage supplied from an alternating-current power source; and a power source circuit which smoothes the alternating-current power voltage output from said full wave rectifier after the full wave rectification, and supplies a direct-current power voltage,
  wherein said control unit further includes: a gate driver circuit which receives the direct-current power voltage supplied from said power source circuit, and outputs a control signal to said first gate electrode and said second electrode; and
  a control circuit which inputs the control signal to said gate driver circuit.

14. A switching power source circuit comprising:
  an input terminal connected to a voltage source;
  an output terminal which outputs a direct-current power voltage;
  one of an inductor and a transducer, the one accumulating energy and inserted between said input terminal and said output terminal;
  a rectifier diode inserted between said input terminal and said output terminal, and connected with an output side of the one of said inductor and said transducer; and
  a switch which controls the energy to be accumulated in the one of said inductor and said transducer,
  wherein said switch is the bi-directional switch according to claim 1, and
  said second electrode is connected to the output side of the one of said inductor and said transducer, and the potential of said second electrode is fixed at a potential higher than the potential of said first electrode.

15. A method of driving a bi-directional switch,
  wherein the bi-directional switch includes:
    a semiconductor stack formed on a substrate, having a channel region, and including one of (i) a nitride semiconductor and (ii) a semiconductor including silicon carbide;
    a first electrode and a second electrode formed at an interval on the semiconductor stack;
    a first gate electrode formed between the first electrode and the second electrode; and
    a second gate electrode formed between the first gate electrode and the second electrode, and
  said method comprising steps of:
    determining whether or not a potential of the first electrode is higher than a potential of the second electrode, in a transition period corresponding to a transition state at a time when the semiconductor device is activated;
    applying, to the first gate electrode, a voltage that is relative to the potential of the first electrode and lower than a first threshold voltage of the first gate electrode, and apply, to the second gate electrode, a voltage that is relative to the potential of the second electrode and higher than a second threshold voltage of the second gate electrode, when the potential of the first electrode is higher than the potential of the second electrode in a transition period corresponding to a transition state after the semiconductor device starts being activated; and
    applying, to the first gate electrode, a voltage that is relative to the potential of the first electrode and higher than the first threshold voltage, and apply, to the second gate electrode, a voltage that is relative to the potential of the second electrode and lower than a second threshold voltage, when the potential of the first electrode is lower than the potential of the second electrode in the transition period.

* * * * *